United States Patent
Royster, Jr. et al.

(10) Patent No.: US 7,569,288 B2
(45) Date of Patent: Aug. 4, 2009

(54) ELECTROLUMINESCENT DEVICE INCLUDING GALLIUM COMPLEXES

(75) Inventors: Tommie L. Royster, Jr., Rochester, NY (US); Michele L. Ricks, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 411 days.

(21) Appl. No.: 11/365,318

(22) Filed: Mar. 1, 2006

(65) Prior Publication Data

US 2007/0207342 A1    Sep. 6, 2007

(51) Int. Cl.
*H01L 51/54* (2006.01)

(52) U.S. Cl. .............. 428/690; 428/917; 313/504; 313/506; 257/E51.041; 257/E51.043

(58) Field of Classification Search .......... 428/690, 428/917; 313/502–509; 257/40, 88–103, 257/E51.001–E51.052; 252/301.16–301.35; 546/2, 10; 544/181, 225; 548/101, 108, 548/402
See application file for complete search history.

(56) References Cited

U.S. PATENT DOCUMENTS

| 6,013,384 | A * | 1/2000 | Kido et al. ............... 428/690 |
| 6,392,250 | B1 | 5/2002 | Aziz et al. |
| 6,420,057 | B1 | 7/2002 | Ueda et al. |
| 6,687,266 | B1 * | 2/2004 | Ma et al. .................... 372/7 |
| 6,703,146 | B1 | 3/2004 | Sakaguchi et al. |
| 7,045,953 | B2 * | 5/2006 | Nakayama et al. .......... 313/504 |
| 7,233,105 | B2 * | 6/2007 | Itai et al. ................... 313/506 |
| 2005/0179370 | A1 | 8/2005 | Nakayama et al. |

FOREIGN PATENT DOCUMENTS

| JP | 1997003447 | | 1/1997 |
| JP | 01081453 | | 3/2001 |
| JP | 2004059535 | * | 2/2004 |
| JP | 2005255890 | | 9/2005 |
| WO | WO 2004060028 | * | 7/2004 |
| WO | WO 2004082338 | * | 9/2004 |
| WO | 2005/099313 | | 10/2005 |
| WO | 2007/070257 | | 6/2007 |
| WO | 2007/084269 | | 7/2007 |

OTHER PUBLICATIONS

Machine Translation of JP 2004059535 (Feb. 2004).*
Machine Translation of JP 2005255890 (Sep. 2005).*
T. L. Royster, Jr., "Electroluminescent Devices with Nitrogen Bidentate Ligands", U.S. Appl. No. 11/172,338 (D-90599) filed Jun. 30, 2005.
T. L. Royster, Jr., et al., "Electroluminescent Device Including a Gallium Complex", U.S. Appl. No. 11/334,532 (D-91628) filed Jan. 18, 2006.

* cited by examiner

*Primary Examiner*—Marie R. Yamnitzky
(74) *Attorney, Agent, or Firm*—Arthur Kluegel; Raymond L. Owens

(57) ABSTRACT

An OLED device comprises an anode, a light emitting layer, a first layer, a second layer contiguous to the first layer, and a cathode, in that order. The first layer includes a first complex comprising gallium and the second layer includes a second complex also comprising gallium and wherein the second complex has a more negative LUMO than the first complex. Such materials can provide an improvement in one or more of luminance, drive voltage, and stability.

12 Claims, 1 Drawing Sheet

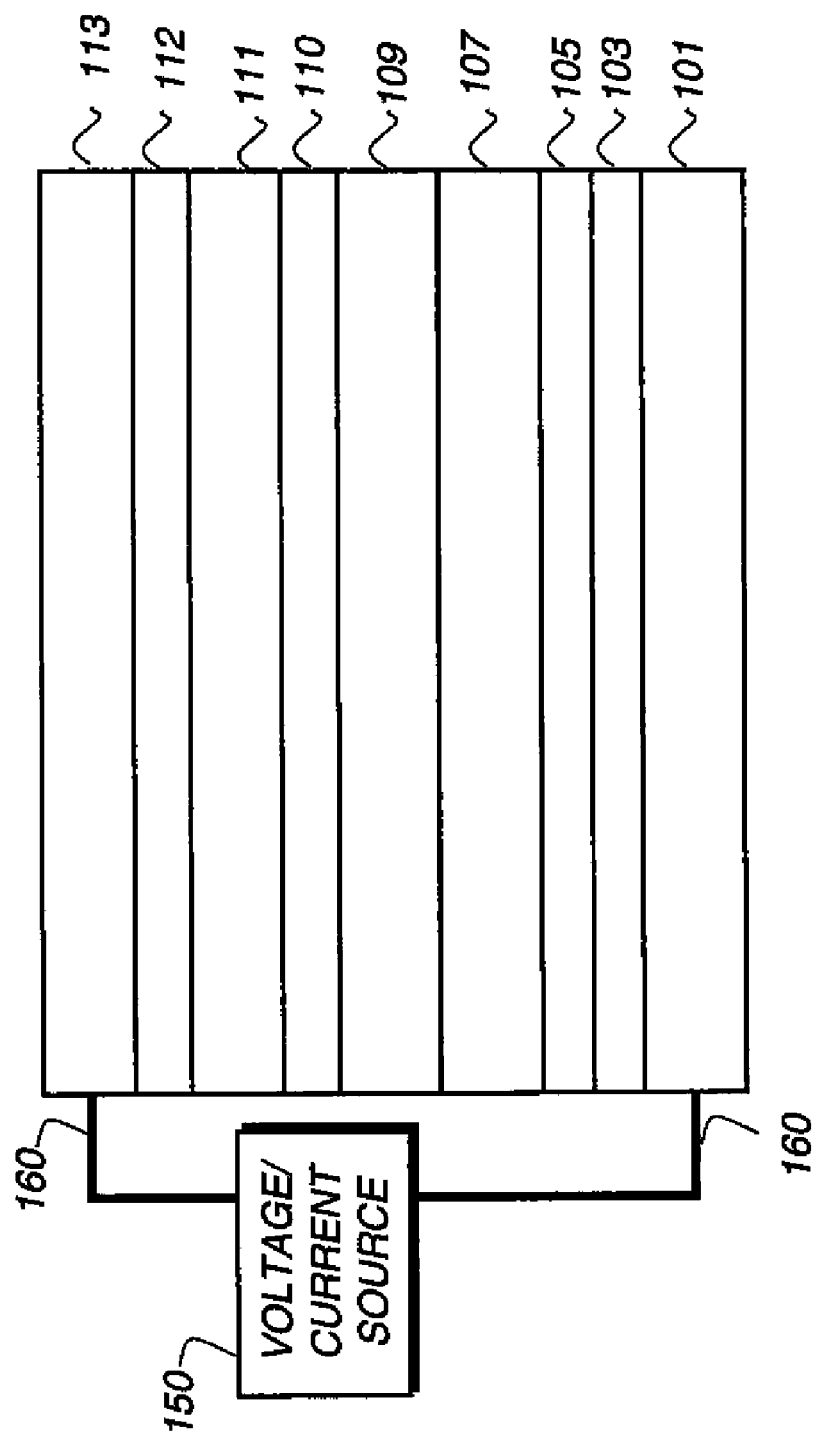

ELECTROLUMINESCENT DEVICE INCLUDING GALLIUM COMPLEXES

CROSS-REFERENCE TO RELATED APPLICATIONS

Reference is made to commonly assigned U.S. patent application Ser. No. 11/172,338 filed Jun. 30, 2005 (now abandoned; publication No. U.S. 2007/0003786) and Ser. No. 11/334,532 filed Jan. 18, 2006 (now abandoned; publication No. U.S. 2007/0166566).

FIELD OF THE INVENTION

This invention relates to an organic light emitting diode (OLED) electroluminescent (EL) device comprising a layer including at least one gallium complex and a second layer including a different gallium complex, which can provide desirable electroluminescent properties.

BACKGROUND OF THE INVENTION

While organic electroluminescent (EL) devices have been known for over two decades, their performance limitations have represented a barrier to many desirable applications. In simplest form, an organic EL device is comprised of an anode for hole injection, a cathode for electron injection, and an organic medium sandwiched between these electrodes to support charge recombination that yields emission of light. These devices are also commonly referred to as organic light-emitting diodes, or OLEDs. Representative of earlier organic EL devices are Gurnee et al. U.S. Pat. No. 3,172,862, issued Mar. 9, 1965; Gurnee U.S. Pat. No. 3,173,050, issued Mar. 9, 1965; Dresner, "Double Injection Electroluminescence in Anthracene", RCA Review, 30, 322, (1969); and Dresner U.S. Pat. No. 3,710,167, issued Jan. 9, 1973. The organic layers in these devices, usually composed of a polycyclic aromatic hydrocarbon, were very thick (much greater than 1 µm). Consequently, operating voltages were very high, often greater than 100V.

More recent organic EL devices include an organic EL element consisting of extremely thin layers (e.g. <1.0 µm) between the anode and the cathode. Herein, the term "organic EL element" encompasses the layers between the anode and cathode. Reducing the thickness lowered the resistance of the organic layers and enabled devices to operate at much lower voltage. In a basic two-layer EL device structure, described first in U.S. Pat. No. 4,356,429, one organic layer of the EL element adjacent to the anode is specifically chosen to transport holes, and therefore is referred to as the hole-transporting layer, and the other organic layer is specifically chosen to transport electrons and is referred to as the electron-transporting layer. Recombination of the injected holes and electrons within the organic EL element results in efficient electroluminescence.

There have also been proposed three-layer organic EL devices that contain an organic light-emitting layer (LEL) between the hole-transporting layer and electron-transporting layer, such as that disclosed by C. Tang et al. (*J. Applied Physics*, Vol. 65, 3610 (1989)). The light-emitting layer commonly consists of a host material doped with a guest material, otherwise known as a dopant. Still further, there has been proposed in U.S. Pat. No. 4,769,292 a four-layer EL element comprising a hole injecting layer (HIL), a hole-transporting layer (HTL), a light-emitting layer (LEL) and an electron-transporting/injecting layer (ETL). These structures have resulted in improved device efficiency.

Since these early inventions, further improvements in device materials have resulted in improved performance in attributes such as color, stability, luminance efficiency and manufacturability, e.g., as disclosed in U.S. Pat. No. 5,061,569, U.S. Pat. No. 5,409,783, U.S. Pat. No. 5,554,450, U.S. Pat. No. 5,593,788, U.S. Pat. No. 5,683,823, U.S. Pat. No. 5,908,581, U.S. Pat. No. 5,928,802, U.S. Pat. No. 6,020,078, and U.S. Pat. No. 6,208,077, amongst others.

EL devices that emit white light have proven to be very useful. They can be used with color filters to produce full-color display devices. They can also be used with color filters in other multicolor or functional-color display devices. White EL devices for use in such display devices are easy to manufacture, and they produce reliable white light in each pixel of the displays. Although the OLEDs are referred to as white, they can appear white or off-white, for this application, the CIE coordinates of the light emitted by the OLED are less important than the requirement that the spectral components passed by each of the color filters be present with sufficient intensity in that light. Thus there is a need for new materials that provide high luminance intensity for use in white OLED devices.

One of the most common materials used in many OLED devices is tris(8-quinolinolato)aluminum (III) (Alq). This metal complex is an excellent electron-transporting material and has been used for many years in the industry. However, it would be desirable to find new materials to replace Alq that would afford further improvements in electroluminescent device performance.

Many new organometallic materials have been investigated for use in electroluminescent devices. For example, U.S. Pat. No. 6,420,057 and JP 2001/081453 describe organometallic complexes included in a light-emitting layer. These complexes include a metal-nitrogen ionic bond as well as a metal-nitrogen dative or coordinate bond. US 2003/068528 and US 2003/059647 describe similar materials used as blocking layers and hole-transporting layers respectively. JP 09003447 reports related organometallic complexes as useful electron-transporting materials.

Commonly assigned U.S. patent application Ser. No. 11/172,338 filed Jun. 30, 2005, (publication No. 2007/0003786)describes an EL device containing a layer that does not emit light and included in that layer is a metal complex that can provide desirable electroluminescent properties. Commonly assigned U.S. patent application Ser. No. 11/334,532 filed Jan. 18, 2006, (publication No. 2007/0166566) describes an EL device containing a layer including a metal gallium complex and a layer that includes an alkaline metal material that also can provide desirable electroluminescent properties.

US 2005/0179370 describes EL devices having more than one electron-transporting layer wherein the layers have different electron-transporting properties. It is reported that it is preferable for the cathode-side electron transporting layer to have an energy gap that is the same as or greater than the adjacent (anode-side) electron-transporting layer. Thus, material in the cathode-side ETL would have an equal or higher (more positive) lowest-unoccupied molecular orbital (LUMO) energy level relative to material in the anode-side ETL, as shown in FIG. 5 of US 2005/0179370. However, this may not result in the most desirable electroluminescent properties. Thus, despite these improvements there remains a further need for combinations of materials that can offer enhanced luminance, reduced drive voltage, or improved stability or all of these features.

SUMMARY OF THE INVENTION

An OLED device comprises an anode, a light emitting layer, a first layer, a second layer contiguous to the first layer, and a cathode, in that order. The first layer includes a first complex comprising gallium and the second layer includes a second complex also comprising gallium and wherein the second complex has a more negative LUMO than the first complex.

Such materials can provide an improvement in one or more of luminance, drive voltage, and stability.

BRIEF DESCRIPTION OF THE DRAWINGS

FIG. 1 shows a schematic cross-sectional view of an OLED device that represents one embodiment of the present invention.

DETAILED DESCRIPTION OF THE INVENTION

The invention is generally described above. The invention provides for an OLED device that includes an anode, a light emitting layer, a first layer, a second layer contiguous to the first layer, and a cathode, in that order. Additional layers may be present. The first layer includes a first complex that is a gallium complex. The second layer includes a second gallium complex that has a more negative LUMO than the first complex in the first layer.

In one embodiment of the invention, the first and second complexes have lowest unoccupied molecular orbital (LUMO) energy values in the range of −2.0 to −3.0 eV, suitably in the range of −2.2 to −2.8 eV, and desirably in the range of −2.3 to −2.7 eV.

LUMO energy levels can be estimated from redox properties of molecules, which can be measured by well-known literature procedures, such as cyclic voltammetry (CV) and Osteryoung square-wave voltammetry (SWV). For a review of electrochemical measurements, see J. O. Bockris and A. K. N. Reddy, *Modern Electrochemistry*, Plenum Press, New York; and A. J. Bard and L. R. Faulkner, *Electrochemical Methods*, John Wiley & Sons, New York, and references cited therein LUMO energy levels can also be estimated from molecular orbital calculations. Typical calculations are carried out by using the B3LYP method as implemented in the Gaussian 98 (Gaussian, Inc., Pittsburgh, Pa.) computer program. The basis set for use with the B3LYP method is defined as follows: MIDI! for all atoms for which MIDI! is defined, 6-31G* for all atoms defined in 6-31G* but not in MIDI!, and either the LACV3P or the LANL2DZ basis set and pseudopotential for atoms not defined in MIDI! or 6-31G*, with LACV3P being the preferred method. For any remaining atoms, any published basis set and pseudopotential may be used. MIDI!, 6-31G* and LANL2DZ are used as implemented in the Gaussian98 computer code and LACV3P is used as implemented in the Jaguar 4.1 (Schrodinger, Inc., Portland Oreg.) computer code.

The positions of the LUMO levels of the first and second complex relative to each other are critical. The second complex should have a more negative LUMO than the first complex. In one embodiment, the difference in the LUMO energy values between the first and second complexes is 0.05 eV or greater, suitably this difference is 0.1 eV or greater, and desirably 0.2 eV or greater.

In one embodiment the first layer is contiguous to the light-emitting layer. Desirably the light-emitting layer includes a host material, and in one suitable embodiment the host material has a more negative LUMO than the first complex. Whether the host has a greater or lower LUMO value relative to the first complex, it is desirable that the difference in LUMO values between the host material and the first complex is 0.2 eV or less, 0.1 eV or less or even 0.05 eV or less.

In one desirable embodiment, both the first and second layers are electron-transporting layers. In one aspect of the invention the second layer is contiguous to the cathode. In an alternative aspect, the second layer is contiguous to an electron-injecting layer. Electron-injecting layers include those described in U.S. Pat. Nos. 5,608,287; 5,776,622; 5,776,623; 6,137,223; and 6,140,763, the disclosures of which are incorporated herein by reference. An electron-injecting layer often consists of a material having a work function less than 4.0 eV. The definition of work function can be found in *CRC Handbook of Chemistry and Physics*, 70th Edition, 1989-1990, CRC Press Inc., page F-132 and a list of the work functions for various metals can be found on pages E-93 and E-94. Typical examples of such metals include Li, Na, K, Be, Mg, Ca, Sr, Ba, Y, La, Sm, Gd, Yb. A thin-film containing low work-function alkaline metals or alkaline earth metals, such as Li, Cs, Ca, Mg can be employed for electron-injection. In addition, an organic material doped with these low work-function metals can also be used effectively as the electron-injecting layer. Examples are Li- or Cs-doped Alq. In one suitable embodiment the electron-injecting layer includes an alkali metal compound such as LiF. In practice, the electron-injecting layer is often a thin layer deposited to a suitable thickness in a range of 0.1-3.0 nm. An interfacial electron-injecting layer in this thickness range will provide effective electron injection into the non-emitting layer described above.

In one embodiment the first complex is a gallium complex that includes a 2-phenylimidazole-group as a ligand. Desirably the first complex is a gallium complex that includes three independently selected 2-phenylimidazole groups as ligands. The ligands may be the same or different. In one suitable embodiment they are the same.

In another embodiment the second complex is a gallium complex that includes a 2-phenybenzimidazole group as a ligand. Desirably the second complex is a gallium complex that includes three independently selected 2-phenylbenzimidazole groups as ligands. The ligands may be the same or different. In one suitable embodiment they are the same.

In a further embodiment, the first or second complex is represented by Formula (1).

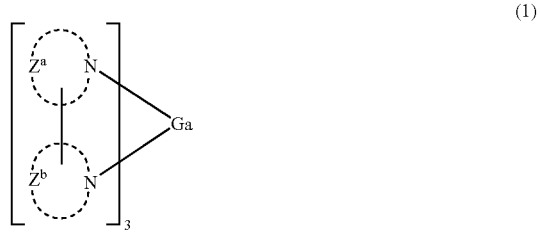

(1)

The ligands in the metal complex of Formula (1) can each be the same or different from one another. In one embodiment the ligands are the same.

Each $Z^a$ and $Z^b$ is independently selected and represents the atoms necessary to complete an unsaturated heterocyclic ring. For example, $Z^a$ and $Z^b$ may represent the atoms necessary to complete an unsaturated five- or six-membered heterocyclic ring. In one embodiment the ring is an aromatic ring. Examples of suitable aromatic rings are a pyridine ring group and an imidazole ring group.

$Z^a$ and $Z^b$ are directly bonded to one another. In addition to being directly bonded, $Z^a$ and $Z^b$ may be further linked together to form a fused ring system. However, in one embodiment, $Z^a$ and $Z^b$ are not further linked together.

Illustrative examples of $Z^a$ and $Z^b$ are shown below.

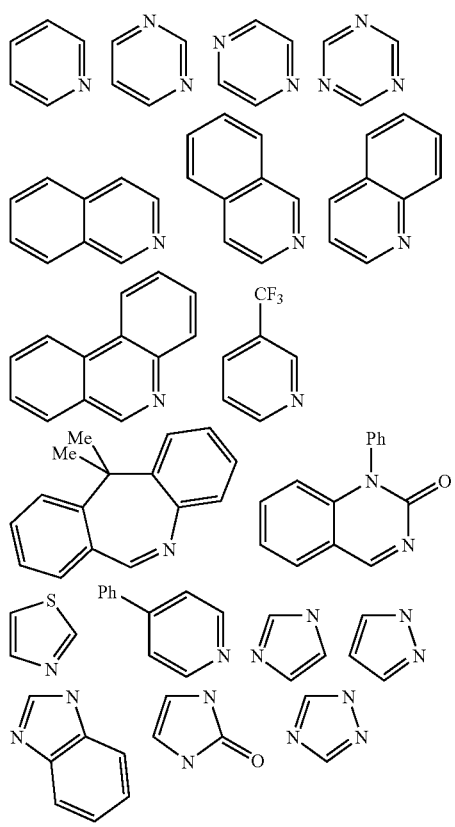

In Formula (1), the Ga bond to the nitrogen of one heterocycle is an ionic bond. An ionic bond is an electrical attraction between two oppositely charged atoms or groups of atoms. In this case, the Ga metal is positively charged and one nitrogen of one heterocycle is negatively charged and the Ga metal and this nitrogen are bonded together. However, it should be understood that this bond could have some covalent character, depending on the particular metal and heterocycle. By way of example, a deprotonated imdazole would be capable of forming an ionic bond of this type with the metal.

In Formula (1), the Ga bond to the nitrogen of the other heterocycle is dative. A dative bond (also called a donor/acceptor bond) is a bond involving a shared pair of electrons in which both electrons come from the same atom, in this case, the nitrogen of the heterocycle. For example, a pyridine ring has a nitrogen with two unshared electrons that can be donated to the metal to form a dative bond.

In another aspect of the invention the first or second gallium complex is represented by Formula (2).

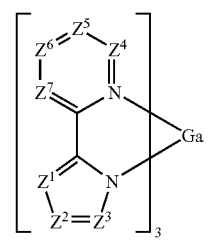

(2)

In Formula (2), each $Z^1$ through $Z^7$ represents N or C—Y. In one embodiment, no more than two, and desirably no more than one of $Z^1$ to $Z^3$ represent N. In another embodiment, no more than one of $Z^4$ to $Z^7$ represents N. Each Y represents hydrogen or an independently selected substituent. Examples of substituents include an alkyl group such as methyl group, an aromatic group such as a phenyl group, a cyano substituent, and a trifluoromethyl group. Two Y substituents may join to form a ring group, for example a fused benzene ring group. In one aspect of the invention, $Z^4$ through $Z^7$ represent C—Y.

In a further aspect of the invention, the first complex is represented by Formula (3a) and the second complex is represented by Formula (3b).

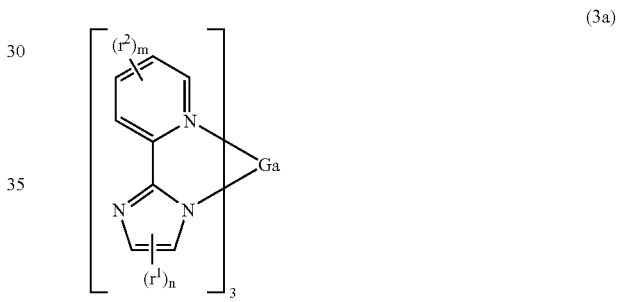

(3a)

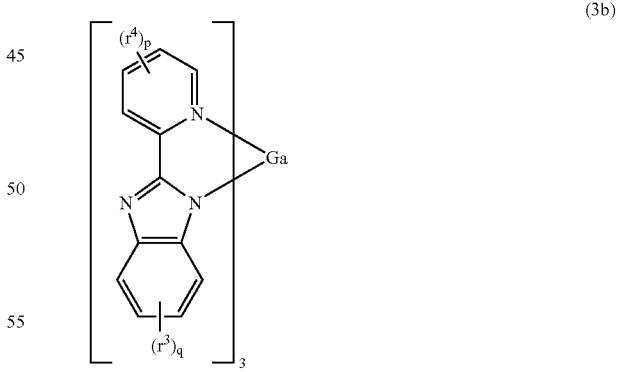

(3b)

In Formula (3a) each $r^1$ may be the same or different and each represents a substituent, such as a methyl group or a phenyl group and n is 0-2. In Formula (3a) and Formula (3b) each $r^2$, $r^3$, and $r^4$ may be the same or different and each represents a substituent, provided adjacent substituents may combine to form a ring group; m, p, and q are independently 0-4.

Formula (1), (2), (3a), and (3b) materials can be prepared from a suitable ligand. Desirably the ligand includes at least one N—H group that can be deprotonated to a nitrogen anion. In one embodiment, this proton is sufficiently acidic to be deprotonated by a metal alkoxide, such as i-propoxide or methoxide. In another embodiment this proton is sufficiently acidic to be deprotonated by cyclopentadiene anion.

A useful synthetic method involves reacting a suitable ligand with a solution of a gallium alkoxide to afford complexes of Formula (1), (2), (3a), and (3b), see for example U.S. Pat. No. 6,420,057, which is incorporated herein by reference. An alternative useful route involves reacting a gallium cyclopentadienyl complex with the appropriate ligand. For example, by reacting tris(cyclopentadienyl)gallium with a ligand (Scheme 1) in a solvent such as toluene.

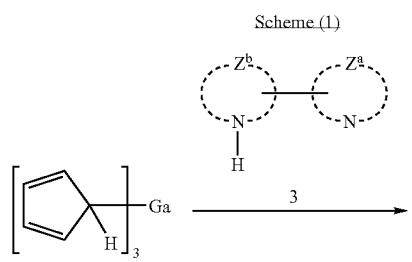

Illustrative examples of useful complexes are given below.

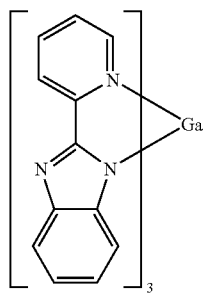

Inv-1

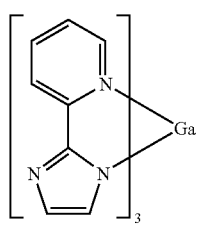

Inv-2

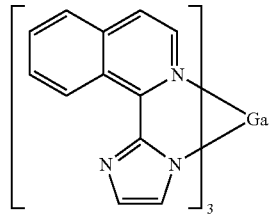

Inv-3

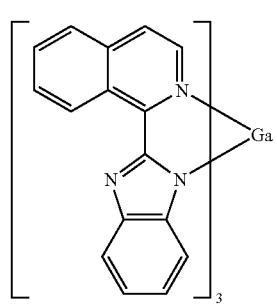

Inv-4

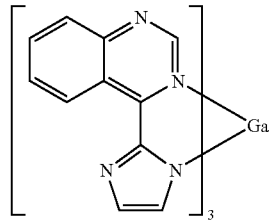

Inv-5

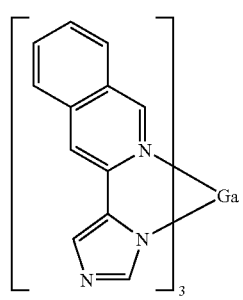

Inv-6

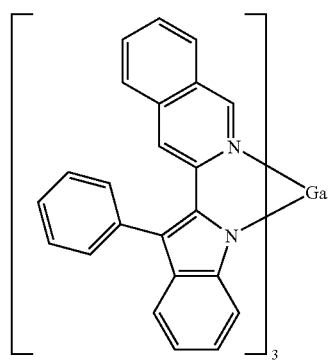

Inv-7

-continued
Inv-8
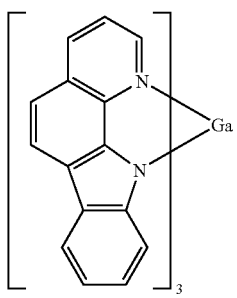
Inv-9
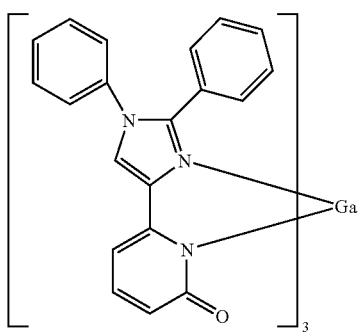
Inv-10
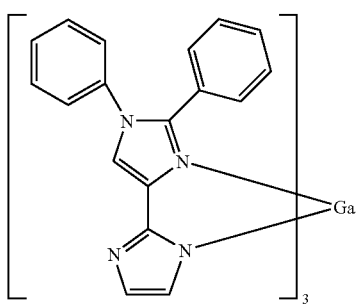
Inv-11
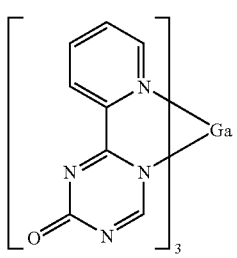
Inv-12
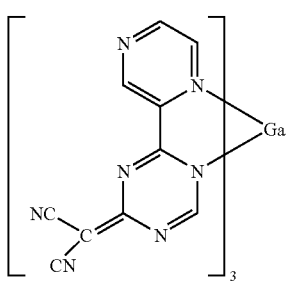
Inv-13
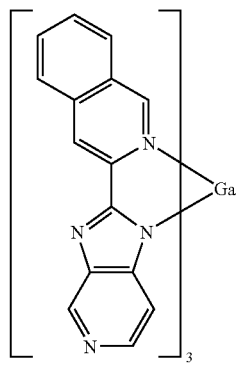
Inv-14
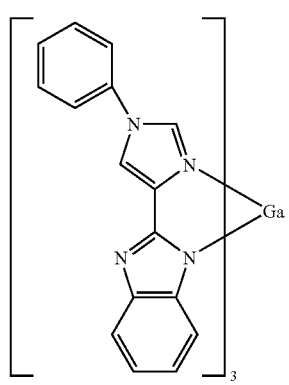
Inv-15
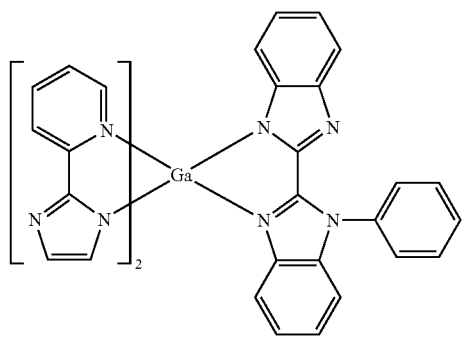
Inv-16
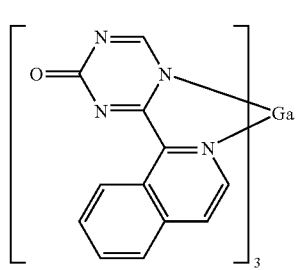

-continued
Inv-17
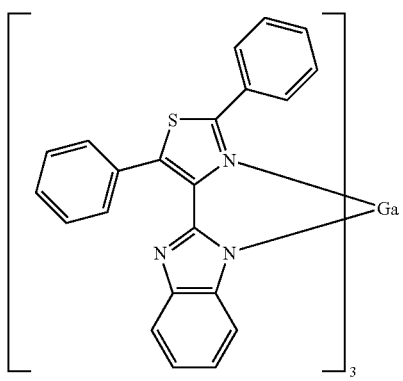
Inv-18
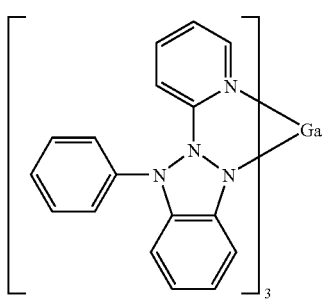
Inv-19
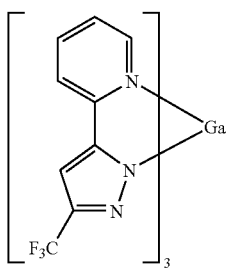
Inv-20
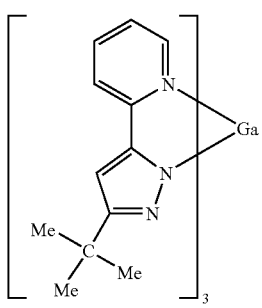
Inv-21
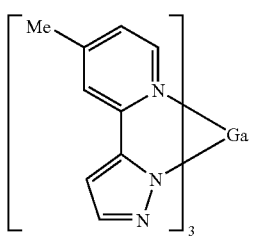
-continued
Inv-22
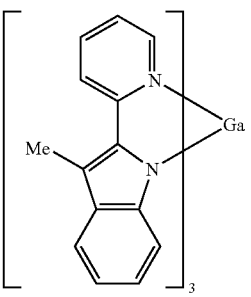
Inv-23
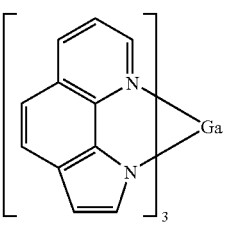
Inv-24
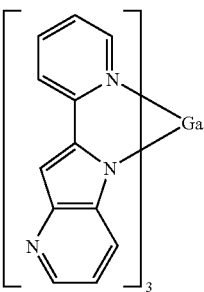
Inv-25
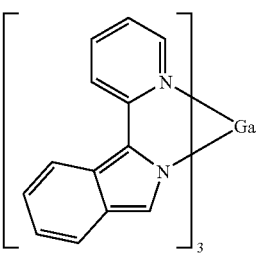
Inv-26
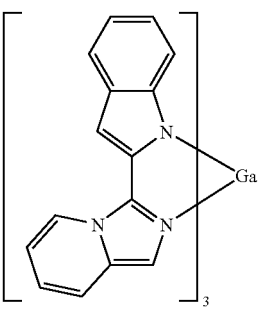
Inv-27

-continued

Inv-30
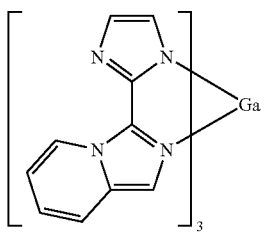

Inv-31
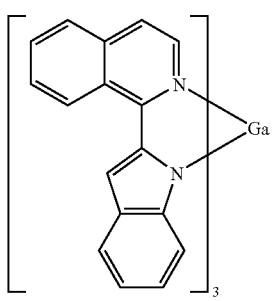

Inv-32
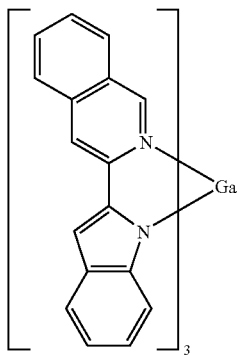

Inv-33
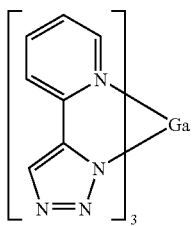

Inv-34
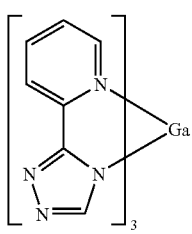

-continued

Inv-35
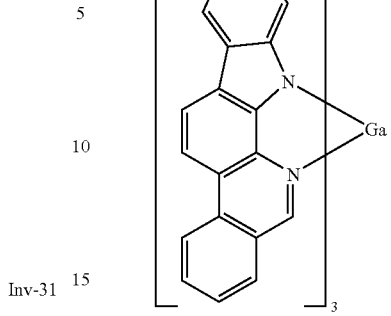

Inv-36
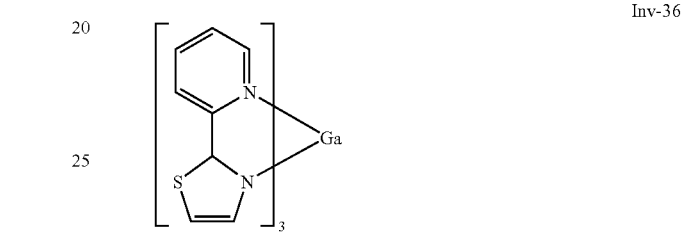

Inv-37
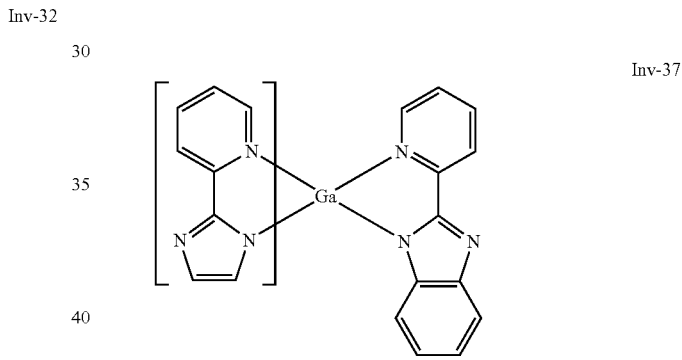

Inv-38
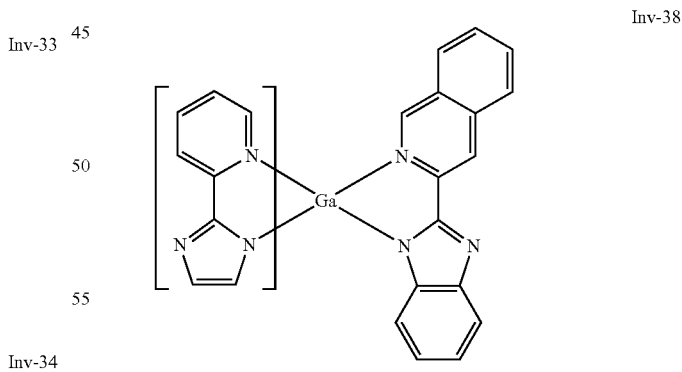

In another aspect of the invention, the second layer, in addition to the second complex, includes an alkali metal material. In this case, an alkali metal material means an elemental alkali metal or any reaction product that includes the metal and is formed after addition of the elemental metal to the layer, in which case the metal may be in ionic form. For example, an alkali metal, such as lithium, may be added to the layer. Without being bound to any particular theory of how the invention works, the metal may react with the second complex to form a new complex in which there is at least a partial transfer of an electron from the alkali metal to the second complex. In this new complex, the alkali metal has a full or partial positive charge and the second complex has a full or partial negative charge. Thus the term "alkali metal material" would include this type of reaction product. In this embodiment, the term is not meant to include the case where salts or complexes containing alkali metal ions, such as, for example lithium fluoride or lithium quinolate, are added directly to the layer.

The alkali metals are Li, Na, K, Rb, Cs, and Fr. In one suitable embodiment, the alkali metal material includes Li, Na, K, or Cs. Desirably, the alkali metal material includes Li.

In one embodiment, the alkali metal material is present at a level of 0.2%-5% by volume of the layer. Desirably, the level is less than 2%. In another suitable embodiment, the molar ratio of the metal complex of Formula (1) to the alkali metal material is between 1:5 and 5:1. Desirably this ratio is about 1:1, for example, within a variation of 10%, the ratio is 1:1.

The EL device may include a fluorescent or a phosphorescent material in the light-emitting layer. In another aspect, the inventive device includes two light-emitting layers, for example in the case where white light is emitted by combining a blue-light emitting layer and a yellow-light emitting layer.

In one desirable embodiment, the light-emitting layer includes one or more host materials and one or more light-emitting materials. Suitably, at least one host material is an anthracene derivative. In one embodiment the host is an anthracene of Formula (4).

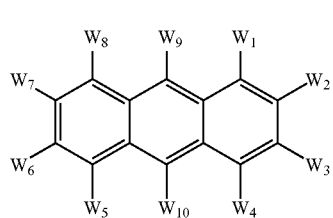

(4)

In Formula (4), $W_1$-$W_{10}$ independently represent hydrogen or an independently selected substituent, provided that two adjacent substituents can combine to form a ring. In one desirable embodiment, $W_9$ and $W_{10}$ represent independently selected naphthyl groups or biphenyl groups. For example, $W_9$ and $W_{10}$ may represent such groups as 1-naphthyl, 2-naphthyl, 4-biphenyl, and 3-biphenyl. In another desirable embodiment, at least one of $W_9$ and $W_{10}$ represents an anthracene group. In a further suitable embodiment, $W_9$ and $W_{10}$ represent independently selected naphthyl groups or biphenyl groups and $W_2$ represents an aromatic group, such as a phenyl group or a naphthyl group. In one embodiment the anthracene compound is selected from the group consisting of 9,10-di-(2-naphthyl)anthracene, 2-t-butyl-9,10-di-(2-naphthyl)anthracene, 9-(2-naphthyl)-10-(4-biphenyl)anthracene, and 9,10-di-(2-naphthyl)-2-phenylanthracene.

The anthracene host can be present as the only host or it can be mixed with other host materials. The anthracene host may also be mixed with other nonanthracene host materials, such as Alq.

Illustrative examples of useful anthracene hosts are shown below.

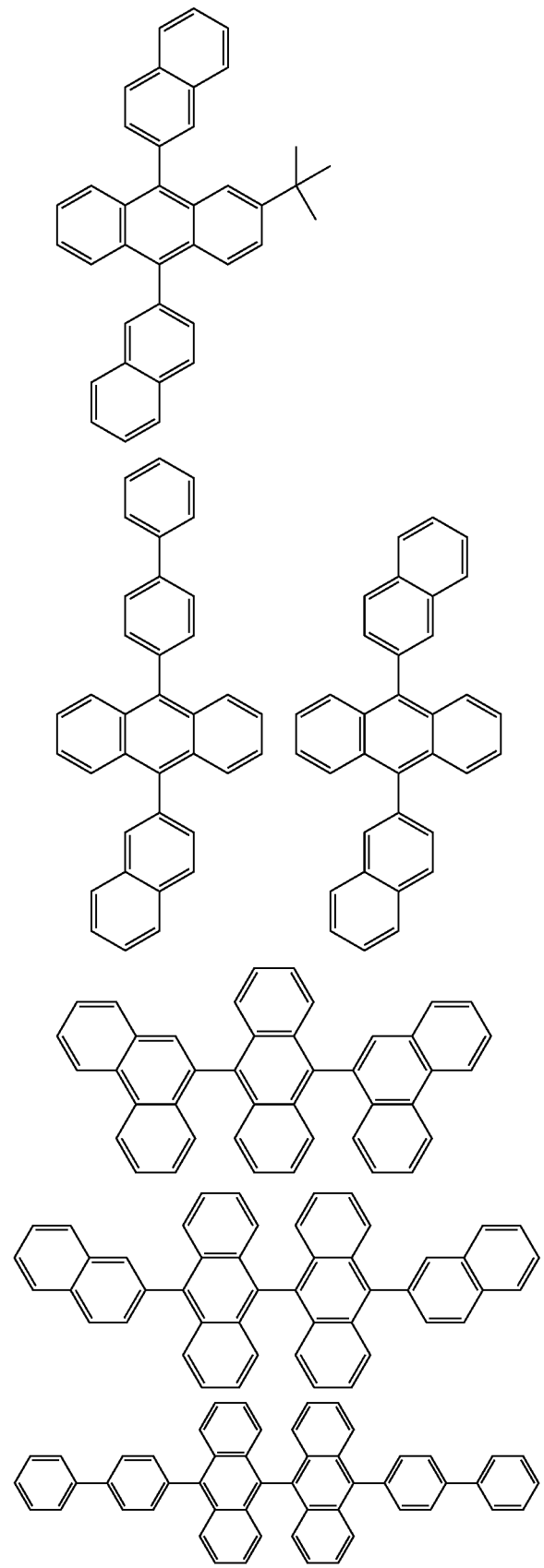

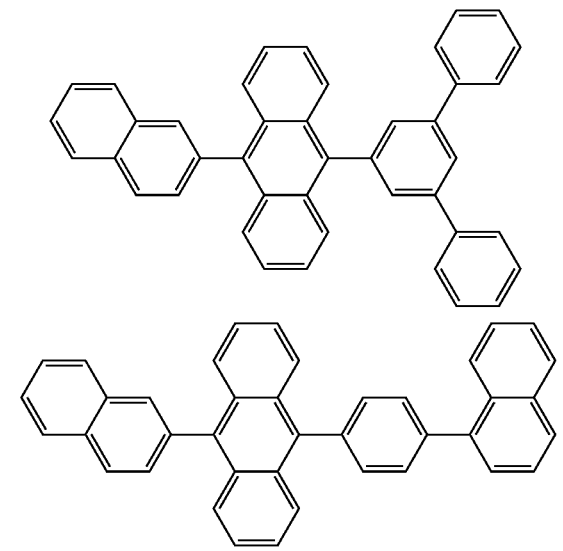
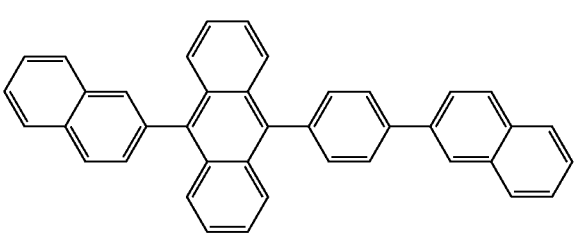
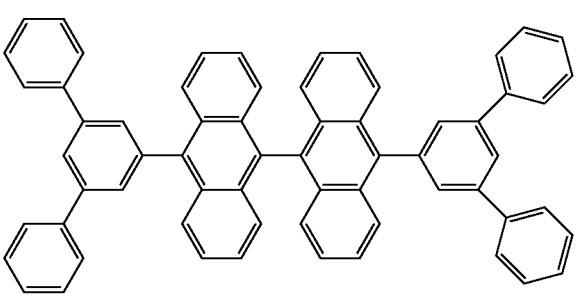
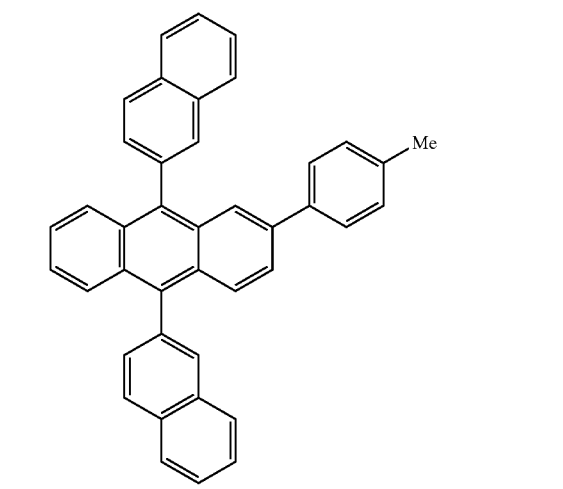
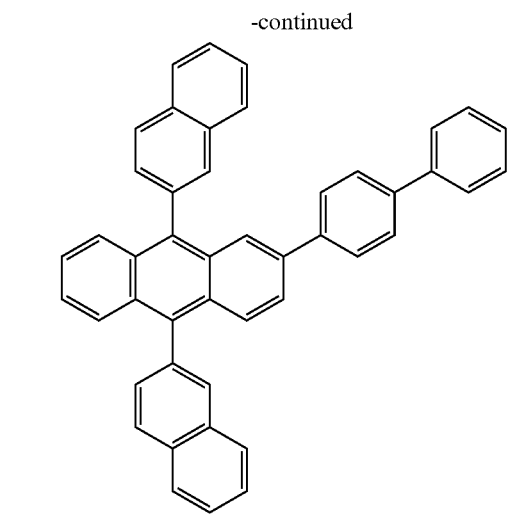
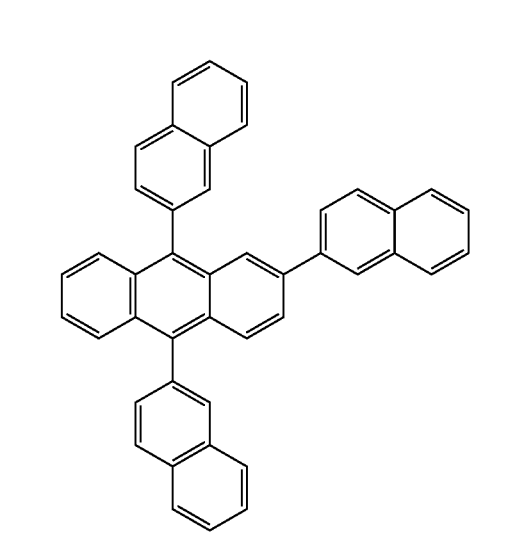

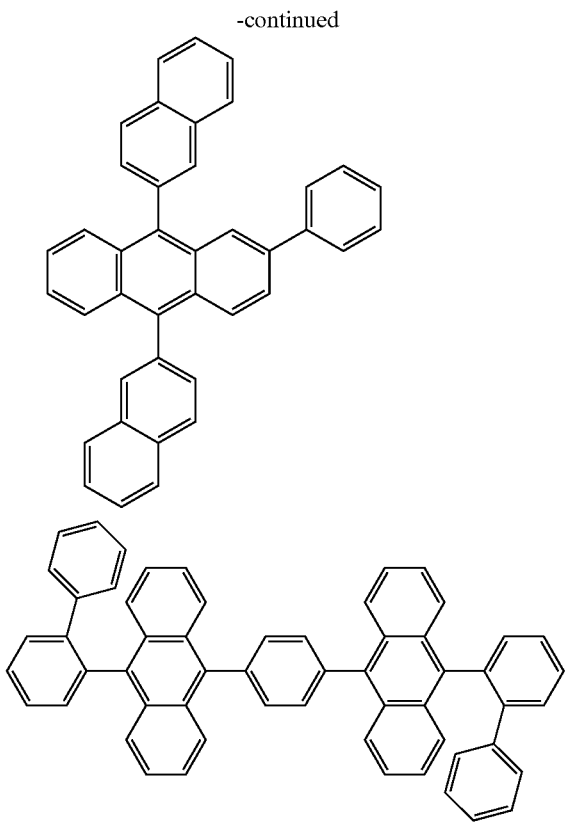

In one embodiment, a co-host is present that is a hole-transporting material. For example the co-host may be a tertiary amine or a mixture of such compounds. Examples of useful hole-transporting co-host materials are 4,4'-bis[N-(1-naphthyl)-N-phenylamino]biphenyl (NPB), and 4,4'-bis[N-(1-naphthyl)-N-(2-naphthyl)amino]biphenyl (TNB).

In another embodiment, a co-host that is an electron-transporting material is present. Metal complexes of 8-hydroxyquinoline and similar derivatives, also known as metal-chelated oxinoid compounds, constitute a class of useful co-host compounds. A useful example of electron-transporting co-host material is tris(8-quinolinolato)aluminum(III) (AlQ).

When present, the co-host is often at a level of 1-50% of the layer, frequently at 1-20% of the layer, and commonly at a level of 5-15% of the layer by volume.

Desirably the LEL includes a light-emitting material(s) which is desirably present in an amount of up to 15% of the light-emitting layer by volume, commonly 0.1-10% and more typically from 0.5-8.0% of the layer by volume.

An important relationship for choosing a light-emitting fluorescent material for use with a host is a comparison of the excited singlet-state energies of the host and the fluorescent material. It is highly desirable that the excited singlet-state energy of the light-emitting material be lower than that of the host material. The excited singlet-state energy is defined as the difference in energy between the emitting singlet state and the ground state. For non-emissive hosts, the lowest excited state of the same electronic spin as the ground state is considered the emitting state.

The layer may emit light ranging from blue to red depending on the nature of the light-emitting material. Blue light is generally defined as having a wavelength range in the visible region of the electromagnetic spectrum of 450-480 nm, blue-green 480-510 nm, green 510-550, green-yellow 550-570 nm, yellow 570-590 nm, orange 590-630 nm and red 630-700 nm, as defined by R. W. Hunt, *The Reproduction of Colour in Photography, Printing & Television*, 4$^{th}$ Edition 1987, Fountain Press. Suitable combinations of these components produce white light.

Many materials that emit blue or blue-green light are known in the art and are contemplated for use in the practice of the present invention. Particularly useful classes of blue emitters include perylene and its derivatives such as a perylene nucleus bearing one or more substituents such as an alkyl group or an aryl group. A desirable perylene derivative for use as an emitting material is 2,5,8,11-tetra-t-butylperylene.

Another useful class of fluorescent materials includes blue or blue-green light emitting derivatives of distyrylarenes, such as distyrylbenzene and distyrylbiphenyl, including compounds described in U.S. Pat. No. 5,121,029. Among derivatives of distyrylarenes that provide blue or blue-green luminescence, particularly useful are those substituted with diarylamino groups, also known as distyrylamines. Examples include Formula (5a) and (5b), listed below, wherein each $R^a$-$R^h$ can be the same or different, and individually represent hydrogen or one or more substituents. For example, substituents can be alkyl groups, such as methyl groups, or aryl groups, such as phenyl groups.

(5a)

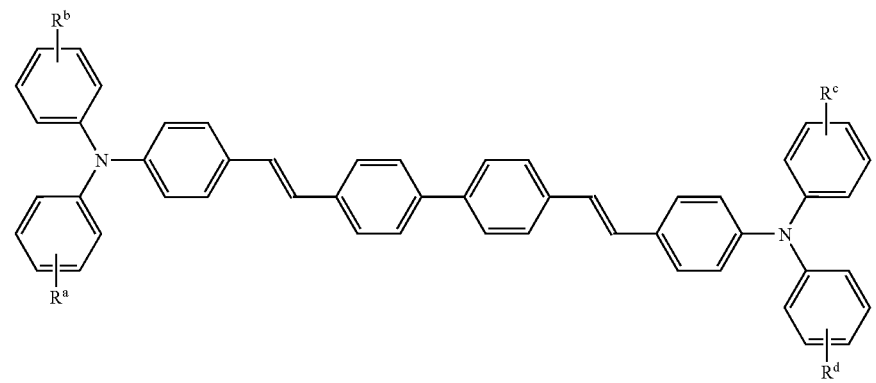

-continued (5b)

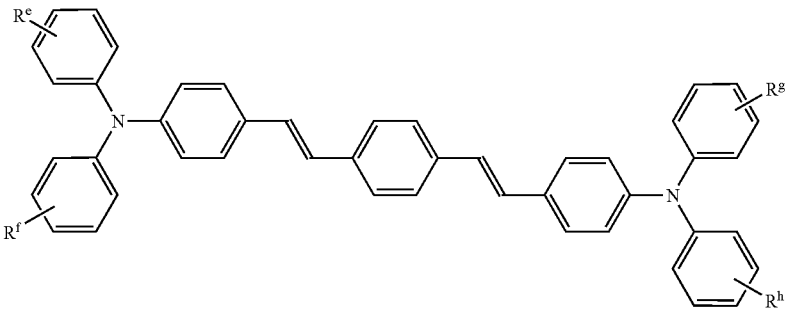

Illustrative examples of useful distyrylamines are blue or blue green emitters listed below.

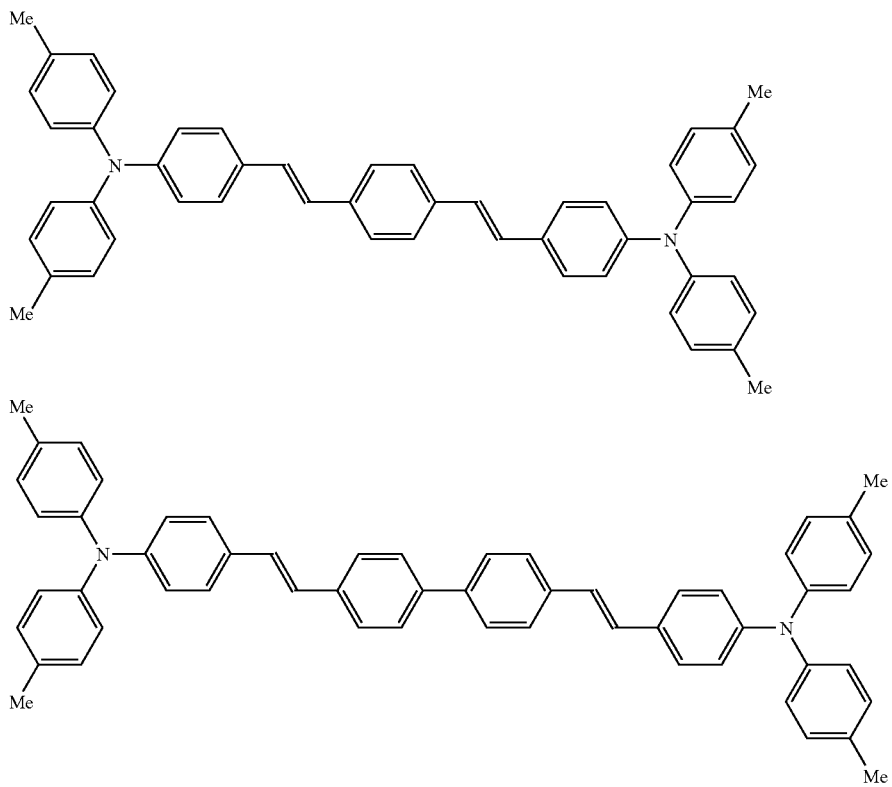

Commonly assigned Ser. No. 10/977,839, filed Oct. 29, 2004 (now abandoned) entitled Organic Element for Electroluminescent Devices by Margaret J. Helber, et al., which is incorporated herein by reference, describes additional useful blue and blue-green light-emitting materials.

In one embodiment the light-emitting material is represented by Formula (6).

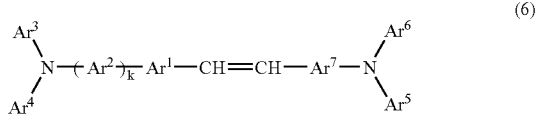

In Formula (6), $Ar^1$ through $Ar^6$ are independently selected aryl groups and may each represent phenyl groups, fused aromatic rings such as naphthyl, anthranyl or phenanthryl, heterocyclic aromatic rings wherein one or more carbon atoms have replaced by nitrogen, oxygen or sulfur, and monovalently linked aromatic rings such as biphenyl, and $Ar^1$ through $Ar^6$ may be unsubstituted or further substituted in those ring positions bearing hydrogens. Additionally $Ar^3$ and $Ar^4$ may be joined directly or through additional atoms to form a carbocyclic or heterocyclic ring. $Ar^5$ and $Ar^6$ may be joined directly or through additional atoms to form a carbocyclic or heterocyclic ring. $Ar^7$ is phenyl, a fused ring aromatic carbocyclic group or a heterocyclic group. $Ar^7$ may be unsubstituted or further substituted in those ring positions bearing hydrogens. In the Formula, k is 1, 2, or 3. Illustrative examples of useful materials are shown below.

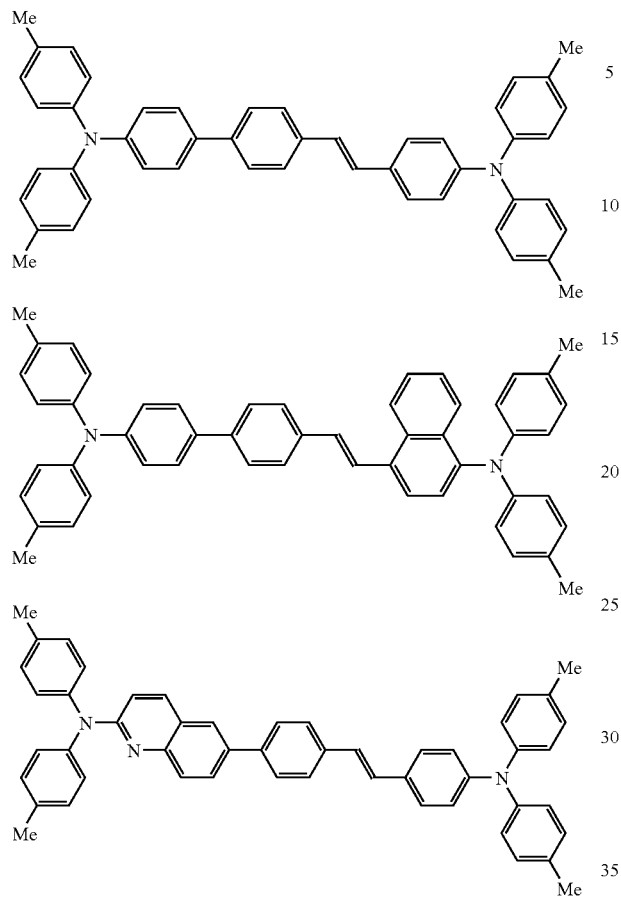

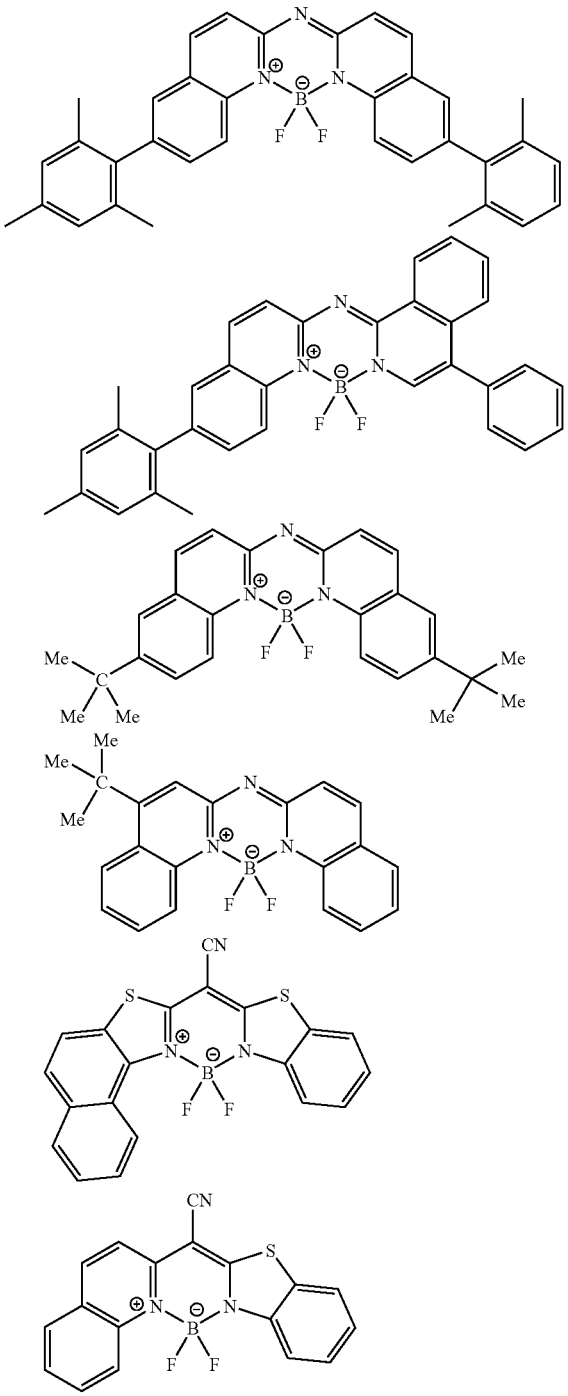

Another useful class of emitters comprise a boron atom. Desirable light-emitting materials that contain boron include those described in US 2003/0198829, US 2003/0201415 and US 2005/0170204, which are incorporated herein by reference. Suitable light-emitting materials, including those that emit blue or blue-green light, are represented by the structure Formula (7).

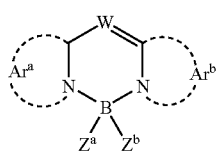

(7)

In Formula (7), $Ar^a$ and $Ar^b$ independently represent the atoms necessary to form a five or six-membered aromatic ring group, such as a pyridine group. $Z^a$ and $Z^b$ represent independently selected substituents, such as fluoro substituents. In Formula (7), w represents N or C—Y, wherein Y represents hydrogen or a substituent, such as an aromatic group, such as a phenyl group or a tolyl group, an alkyl group, such as a methyl group, a cyano substituent, or a trifluoromethyl substituent.

Illustrative examples of useful boron-containing fluorescent materials are listed below.

Unless otherwise specifically stated, use of the term "substituted" or "substituent" means any group or atom other than hydrogen. Additionally, unless otherwise specifically stated, when a compound with a substitutable hydrogen is identified or the term "group" is used, it is intended to encompass not only the substituent's unsubstituted form, but also its form further substituted with any substituent group or groups as herein mentioned, so long as the substituent does not destroy properties necessary for device utility. Suitably, a substituent group may be halogen or may be bonded to the remainder of the molecule by an atom of carbon, silicon, oxygen, nitrogen, phosphorous, sulfur, selenium, or boron. The substituent may be, for example, halogen, such as chloro, bromo or fluoro; nitro; hydroxyl; cyano; carboxyl; or groups which may be further substituted, such as alkyl, including straight or branched chain or cyclic alkyl, such as methyl, trifluoromethyl, ethyl, t-butyl, 3-(2,4-di-t-pentylphenoxy) propyl, and tetradecyl; alkenyl, such as ethylene, 2-butene; alkoxy, such as methoxy, ethoxy, propoxy, butoxy, 2-methoxyethoxy, sec-butoxy, hexyloxy, 2-ethylhexyloxy, tetradecyloxy, 2-(2,4-di-t-pentylphenoxy)ethoxy, and 2-dodecyloxyethoxy; aryl such as phenyl, 4-t-butylphenyl, 2,4,6-trimethylphenyl, naphthyl; aryloxy, such as phenoxy, 2-methylphenoxy, alpha- or beta-naphthyloxy, and 4-tolyloxy; carbonamido, such as acetamido, benzamido, butyramido, tetradecanamido, alpha-(2,4-di-t-pentyl-phenoxy)acetamido, alpha-(2,4-di-t-pentylphenoxy)butyramido, alpha-(3-pentadecylphenoxy)-hexanamido, alpha-(4-hydroxy-3-t-butylphenoxy)-tetradecanamido, 2-oxo-pyrrolidin-1-yl, 2-oxo-5-tetradecylpyrrolin-1-yl, N-methyltetradecanamido, N-succinimido, N-phthalimido, 2,5-dioxo-1-oxazolidinyl, 3-dodecyl-2,5-dioxo-1-imidazolyl, and N-acetyl-N-dodecylamino, ethoxycarbonylamino, phenoxycarbonylamino, benzyloxycarbonylamino, hexadecyloxycarbonylamino, 2,4-di-t-butylphenoxycarbonylamino, phenylcarbonylamino, 2,5-(di-t-pentylphenyl)carbonylamino, p-dodecyl-phenylcarbonylamino, p-tolylcarbonylamino, N-methylureido, N,N-dimethylureido, N-methyl-N-dodecylureido, N-hexadecylureido, N,N-dioctadecylureido, N,N-dioctyl-N'-ethylureido, N-phenylureido, N,N-diphenylureido, N-phenyl-N-p-tolylureido, N-(m-hexadecylphenyl) ureido, N,N-(2,5-di-t-pentylphenyl)-N'-ethylureido, and t-butylcarbonamido; sulfonamido, such as methylsulfonamido, benzenesulfonamido, p-tolylsulfonamido, p-dodecylbenzenesulfonamido, N-methyltetradecylsulfonamido, N,N-dipropyl-sulfamoylamino, and hexadecylsulfonamido; sulfamoyl, such as N-methylsulfamoyl, N-ethylsulfamoyl, N,N-dipropylsulfamoyl, N-hexadecylsulfamoyl, N,N-dimethylsulfamoyl, N-[3-(dodecyloxy)propyl]sulfamoyl, N-[4-(2,4-di-t-pentylphenoxy)butyl]sulfamoyl, N-methyl-N-tetradecylsulfamoyl, and N-dodecylsulfamoyl; carbamoyl, such as N-methylcarbamoyl, N,N-dibutylcarbamoyl, N-octadecylcarbamoyl, N-[4-(2,4-di-t-pentylphenoxy)butyl]carbamoyl, N-methyl-N-tetradecylcarbamoyl, and N,N-dioctylcarbamoyl; acyl, such as acetyl, (2,4-di-t-amylphenoxy)acetyl, phenoxycarbonyl, p-dodecyloxyphenoxycarbonyl methoxycarbonyl, butoxycarbonyl, tetradecyloxycarbonyl, ethoxycarbonyl, benzyloxycarbonyl, 3-pentadecyloxycarbonyl, and dodecyloxycarbonyl; sulfonyl, such as methoxysulfonyl, octyloxysulfonyl, tetradecyloxysulfonyl, 2-ethylhexyloxysulfonyl, phenoxysulfonyl, 2,4-di-t-pentylphenoxysulfonyl, methylsulfonyl, octylsulfonyl, 2-ethylhexylsulfonyl, dodecylsulfonyl, hexadecylsulfonyl, phenylsulfonyl, 4-nonylphenylsulfonyl, and p-tolylsulfonyl; sulfonyloxy, such as dodecylsulfonyloxy, and hexadecylsulfonyloxy; sulfinyl, such as methylsulfinyl, octylsulfinyl, 2-ethylhexylsulfinyl, dodecylsulfinyl, hexadecylsulfinyl, phenylsulfinyl, 4-nonylphenylsulfinyl, and p-tolylsulfinyl; thio, such as ethylthio, octylthio, benzylthio, tetradecylthio, 2-(2,4-di-t-pentylphenoxy)ethylthio, phenylthio, 2-butoxy-5-t-octylphenylthio, and p-tolylthio; acyloxy, such as acetyloxy, benzoyloxy, octadecanoyloxy, p-dodecylamidobenzoyloxy, N-phenylcarbamoyloxy, N-ethylcarbamoyloxy, and cyclohexylcarbonyloxy; amine, such as phenylanilino, 2-chloroanilino, diethylamine, dodecylamine; imino, such as 1 (N-phenylimido)ethyl, N-succinimido or 3-benzylhydantoinyl; phosphate, such as dimethylphosphate and ethylbutylphosphate; phosphite, such as diethyl and dihexylphosphite; a heterocyclic group, a heterocyclic oxy group or a heterocyclic thio group, each of which may be substituted and which contain a 3 to 7 membered heterocyclic ring composed of carbon atoms and at least one hetero atom selected from the group consisting of oxygen, nitrogen, sulfur, phosphorous, or boron. Such as 2-furyl, 2-thienyl, 2-benzimidazolyloxy or 2-benzothiazolyl; quaternary ammonium, such as triethylammonium; quaternary phosphonium, such as triphenylphosphonium; and silyloxy, such as trimethylsilyloxy.

If desired, the substituents may themselves be further substituted one or more times with the described substituent groups. The particular substituents used may be selected by those skilled in the art to attain desirable properties for a specific application and can include, for example, electron-withdrawing groups, electron-donating groups, and steric groups. When a molecule may have two or more substituents, the substituents may be joined together to form a ring such as a fused ring unless otherwise provided. Generally, the above groups and substituents thereof may include those having up to 48 carbon atoms, typically 1 to 36 carbon atoms and usually less than 24 carbon atoms, but greater numbers are possible depending on the particular substituents selected.

For the purpose of this invention, also included in the definition of a heterocyclic ring are those rings that include coordinate or dative bonds. The definition of a coordinate bond can be found in *Grant & Hackh's Chemical Dictionary*, page 91. In essence, a coordinate bond is formed when electron rich atoms such as O or N, donate a pair of electrons to electron deficient atoms such as Al or B.

It is well within the skill of the art to determine whether a particular group is electron donating or electron accepting. The most common measure of electron donating and accepting properties is in terms of Hammett σ values. Hydrogen has a Hammett σ value of zero, while electron donating groups have negative Hammett σ values and electron accepting groups have positive Hammett σ values. Lange's handbook of Chemistry, 12$^{th}$ Ed., McGraw Hill, 1979, Table 3-12, pp. 3-134 to 3-138, here incorporated by reference, lists Hammett σ values for a large number of commonly encountered groups. Hammett σ values are assigned based on phenyl ring substitution, but they provide a practical guide for qualitatively selecting electron donating and accepting groups.

Suitable electron donating groups may be selected from —R', —OR', and —NR'(R") where R' is a hydrocarbon containing up to 6 carbon atoms and R" is hydrogen or R'. Specific examples of electron donating groups include methyl, ethyl, phenyl, methoxy, ethoxy, phenoxy, —N(CH$_3$)$_2$, —N(CH$_2$CH$_3$)$_2$, —NHCH$_3$, —N(C$_6$H$_5$)$_2$, —N(CH$_3$)(C$_6$H$_5$), and —NHC$_6$H$_5$.

Suitable electron accepting groups may be selected from the group consisting of cyano, α-haloalkyl, α-haloalkoxy, amido, sulfonyl, carbonyl, carbonyloxy and oxycarbonyl substituents containing up to 10 carbon atoms. Specific examples include —CN, —F, —CF$_3$, —OCF$_3$, —CONHC$_6$H$_5$, —SO$_2$C$_6$H$_5$, —COC$_6$H$_5$, —CO$_2$C$_6$H$_5$, and —OCOC$_6$H$_5$.

General Device Architecture

The present invention can be employed in many OLED device configurations using small molecule materials, oligomeric materials, polymeric materials, or combinations thereof. These include very simple structures comprising a single anode and cathode to more complex devices, such as passive matrix displays comprised of orthogonal arrays of anodes and cathodes to form pixels, and active-matrix displays where each pixel is controlled independently, for example, with thin film transistors (TFTs).

There are numerous configurations of the organic layers wherein the present invention can be successfully practiced. The essential requirements of an OLED are an anode, a cathode, and an organic light-emitting layer located between the anode and cathode. Additional layers may be employed as more fully described hereafter.

A typical structure, especially useful for of a small molecule device, is shown in the Figure and is comprised of a substrate 101, an anode 103, a hole-injecting layer 105, a hole-transporting layer 107, a light-emitting layer 109, an first and second electron-transporting layers 110 and 111, an electron-injecting layer 112, and a cathode 113. These layers are described in detail below. Note that the substrate may alternatively be located adjacent to the cathode, or the substrate may actually constitute the anode or cathode. The organic layers between the anode and cathode are conveniently referred to as the organic EL element. Also, the total combined thickness of the organic layers is desirably less than 500 nm.

The anode and cathode of the OLED are connected to a voltage/current source 150 through electrical conductors 160. The OLED is operated by applying a potential between the anode and cathode such that the anode is at a more positive potential than the cathode. Holes are injected into the organic EL element from the anode and electrons are injected into the organic EL element at the cathode. Enhanced device stability can sometimes be achieved when the OLED is operated in an AC mode where, for some time period in the cycle, the potential bias is reversed and no current flows. An example of an AC driven OLED is described in U.S. Pat. No. 5,552,678.

Substrate

The OLED device of this invention is typically provided over a supporting substrate 101 where either the cathode or anode can be in contact with the substrate. The substrate can be a complex structure comprising multiple layers of materials. This is typically the case for active matrix substrates wherein TFTs are provided below the OLED layers. It is still necessary that the substrate, at least in the emissive pixilated areas, be comprised of largely transparent materials. The electrode in contact with the substrate is conveniently referred to as the bottom electrode. Conventionally, the bottom electrode is the anode, but this invention is not limited to that configuration. The substrate can either be light transmissive or opaque, depending on the intended direction of light emission. The light transmissive property is desirable for viewing the EL emission through the substrate. Transparent glass or plastic is commonly employed in such cases. For applications where the EL emission is viewed through the top electrode, the transmissive characteristic of the bottom support can be light transmissive, light absorbing or light reflective. Substrates for use in this case include, but are not limited to, glass, plastic, semiconductor materials, silicon, ceramics, and circuit board materials. It is necessary to provide in these device configurations a light-transparent top electrode.

Anode

When the desired electroluminescent light emission (EL) is viewed through anode, the anode should be transparent or substantially transparent to the emission of interest. Common transparent anode materials used in this invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used as the anode. For applications where EL emission is viewed only through the cathode, the transmissive characteristics of the anode are immaterial and any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater. Desired anode materials are commonly deposited by any suitable means such as evaporation, sputtering, chemical vapor deposition, or electrochemical means. Anodes can be patterned using well-known photolithographic processes. Optionally, anodes may be polished prior to application of other layers to reduce surface roughness so as to minimize shorts or enhance reflectivity.

Hole-Injecting Layer (HIL)

While not always necessary, it is often useful that a hole-injecting layer 105 be provided between anode 103 and hole-transporting layer 107. The hole-injecting material can serve to improve the film formation property of subsequent organic layers and to facilitate injection of holes into the hole-transporting layer. Suitable materials for use in the hole-injecting layer include, but are not limited to, porphyrinic compounds as described in U.S. Pat. No. 4,720,432, plasma-deposited fluorocarbon polymers as described in U.S. Pat. No. 6,208,075, and some aromatic amines, for example, m-MTDATA (4,4',4"-tris[(3-methylphenyl)phenylamino]triphenylamine). Alternative hole-injecting materials reportedly useful in organic EL devices are described in EP 0891121 and EP 1029909.

Additional useful hole-injecting materials are described in U.S. Pat. No. 6,720,573. For example, the material below may be useful for such purposes.

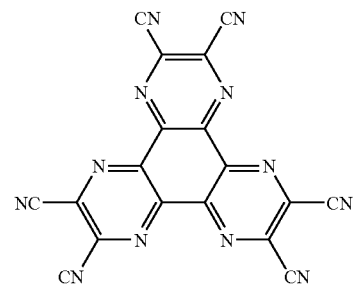

Hole-Transporting Layer (HTL)

The hole-transporting layer 107 of the organic EL device contains at least one hole-transporting compound, such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. U.S. Pat. No. 3,180,730. Other suitable triarylamines substituted with one or more vinyl radicals and/or comprising at least one active hydrogen containing group are disclosed by Brantley et al. U.S. Pat. No. 3,567,450 and U.S. Pat. No. 3,658,520.

A more preferred class of aromatic tertiary amines are those which include at least two aromatic tertiary amine moieties as described in U.S. Pat. No. 4,720,432 U.S. Pat. No. 5,061,569. Such compounds include those represented by structural Formula (A).

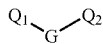

In Formula (A), $Q_1$ and $Q_2$ are independently selected aromatic tertiary amine moieties and G is a linking group such as an arylene, cycloalkylene, or alkylene group of a carbon to carbon bond. In one embodiment, at least one of $Q_1$ or $Q_2$ contains a polycyclic fused ring structure, e.g., a naphthalene. When G is an aryl group, it is conveniently a phenylene, biphenylene, or naphthalenediyl moiety.

A useful class of triarylamines satisfying structural Formula (A) and containing two triarylamine moieties is represented by structural Formula (B).

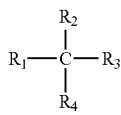

In Formula (B), $R_1$ and $R_2$ each independently represents a hydrogen atom, an aryl group, or an alkyl group or $R_1$ and $R_2$ together represent the atoms completing a cycloalkyl group; and $R_3$ and $R_4$ each independently represents an aryl group, which is in turn substituted with a diaryl substituted amino group, as indicated by structural Formula (C).

In Formula (C), $R_5$ and $R_6$ are independently selected aryl groups. In one embodiment, at least one of $R_5$ or $R_6$ contains a polycyclic fused ring structure, e.g., a naphthalene.

Another class of aromatic tertiary amines are the tetraaryldiamines. Desirable tetraaryldiamines include two diarylamino groups, such as indicated by Formula (C), linked through an arylene group. Useful tetraaryldiamines include those represented by Formula (D).

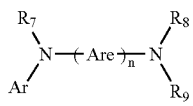

In Formula (D), each Are is an independently selected arylene group, such as a phenylene, naphthylenediyl or anthracenediyl moiety and n is an integer of from 1 to 4. Ar, $R_7$, $R_8$, and $R_9$ are independently selected aryl groups. In a typical embodiment, at least one of Ar, $R_7$, $R_8$, and $R_9$ is a polycyclic fused ring structure, e.g., a naphthalene.

The various alkyl, alkylene, aryl, and arylene moieties of the foregoing structural Formulae (A), (B), (C), (D), can each in turn be substituted. Typical substituents include alkyl groups, alkoxy groups, aryl groups, aryloxy groups, benzo and halogen such as fluoride. The various alkyl and alkylene moieties typically contain from about 1 to 6 carbon atoms. The cycloalkyl moieties can contain from 3 to about 10 carbon atoms, but typically contain five, six, or seven ring carbon atoms—e.g., cyclopentyl, cyclohexyl, and cycloheptyl ring structures. The aryl and arylene moieties are usually phenyl and phenylene moieties.

The hole-transporting layer can be formed of a single or a mixture of aromatic tertiary amine compounds. Specifically, one may employ a triarylamine, such as a triarylamine satisfying the Formula (B), in combination with a tetraaryldiamine, such as indicated by Formula (D). When a triarylamine is employed in combination with a tetraaryldiamine, the latter is positioned as a layer interposed between the triarylamine and the electron injecting and transporting layer. Illustrative of useful aromatic tertiary amines are the following:

1,1-Bis(4-di-p-tolylaminophenyl)cyclohexane (TAPC)
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl N-Phenylcarbazole
4,4'-Bis[N-(1-naphthyl)-N-phenylamino]biphenyl
4,4'-Bis[N-(1-naphthyl)-N-(2-naphthyl)amino]biphenyl
4,4"-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis{N-phenyl-N-[4-(1-naphthyl)-phenyl]amino}biphenyl
4,4'-Bis[N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene
4,4',4"-tris[(3-methylphenyl)phenylamino]triphenylamine.

Another class of useful hole-transporting materials includes polycyclic aromatic compounds as described in EP 1,009,041. Tertiary aromatic amines with more than two amine groups may be used including oligomeric materials. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Light-Emitting Layer (LEL)

The light-emitting layer has been described previously. A useful device may have more than one light-emitting layers. The light-emitting layer (LEL) of the organic EL element includes a luminescent fluorescent or phosphorescent material where electroluminescence is produced as a result of electron-hole pair recombination in this region. The light-emitting layer can be comprised of a single material, but more commonly consists of a host material doped with a guest emitting material or materials where light emission comes primarily from the emitting materials and can be of any color. The host materials in the light-emitting layer can be an electron-transporting material, as defined below, a hole-transporting material, as defined above, or another material or combination of materials that support hole-electron recombination. The emitting material is usually chosen from highly fluorescent dyes and phosphorescent compounds, e.g., transition metal complexes as described in WO 98/55561, WO 00/18851, WO 00/57676, and WO 00/70655. Emitting materials are typically incorporated at 0.01 to 10% by weight of the host material.

The host and emitting materials can be small non-polymeric molecules or polymeric materials such as polyfluorenes and polyvinylarylenes (e.g., poly(p-phenylenevinylene), PPV). In the case of polymers, small molecule emitting materials can be molecularly dispersed into a polymeric host, or the emitting materials can be added by copolymerizing a minor constituent into a host polymer.

As discussed previously, an important relationship for choosing an emitting material is a comparison of the bandgap potential which is defined as the energy difference between the highest occupied molecular orbital and the lowest unoccupied molecular orbital of the molecule. For efficient energy transfer from the host to the emitting material, a necessary condition is that the band gap of the dopant is smaller than that of the host material. For phosphorescent emitters it is also important that the host triplet energy level of the host be high enough to enable energy transfer from host to emitting material.

Host and emitting materials known to be of use include, but are not limited to, those disclosed in U.S. Pat. Nos. 4,768,292, 5,141,671, 5,150,006, 5,151,629, 5,405,709, 5,484,922, 5,593,788, 5,645,948, 5,683,823, 5,755,999, 5,928,802, 5,935,720, 5,935,721, and 6,020,078.

Metal complexes of 8-hydroxyquinoline and similar derivatives (Formula E) constitute one class of useful host compounds capable of supporting electroluminescence, and are particularly suitable for light emission of wavelengths longer than 500 nm, e.g., green, yellow, orange, and red.

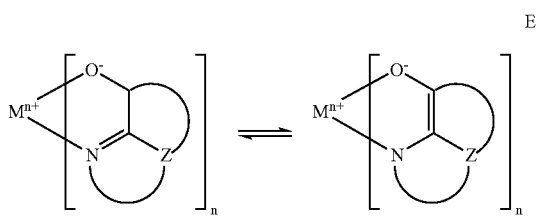

E

In Formula (E), M represents a metal; n is an integer of from 1 to 4; and Z independently in each occurrence represents the atoms completing a nucleus having at least two fused aromatic rings.

From the foregoing it is apparent that the metal can be monovalent, divalent, trivalent, or tetravalent metal. The metal can, for example, be an alkali metal, such as lithium, sodium, or potassium; an alkaline earth metal, such as magnesium or calcium; an earth metal, such aluminum or gallium, or a transition metal such as zinc or zirconium. Generally any monovalent, divalent, trivalent, or tetravalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Illustrative of useful chelated oxinoid compounds are the following:

CO-1: Aluminum trisoxine[alias,tris(8-quinolinolato)aluminum(III); Alq]

CO-2: Magnesium bisoxine[alias,bis(8-quinolinolato)magnesium(II)]

CO-3: Bis[benzo{f}-8-quinolinolato]zinc(II)

CO-4: Bis(2-methyl-8-quinolinolato)aluminum(III)-μ-oxo-bis(2-methyl-8-quinolinolato)aluminum(III)

CO-5: Indium trisoxine[alias,tris(8-quinolinolato)indium]

CO-6: Aluminum tris(5-methyloxine)[alias,tris(5-methyl-8-quinolinolato)aluminum(III)]

CO-7: Lithium oxine[alias,(8-quinolinolato)lithium(I)]

CO-8: Gallium oxine[alias,tris(8-quinolinolato)gallium(III)]

CO-9: Zirconium oxine[alias,tetra(8-quinolinolato)zirconium(IV)].

Derivatives of anthracene (Formula F) constitute one class of useful host materials capable of supporting electroluminescence, and are particularly suitable for light emission of wavelengths longer than 400 nm, e.g., blue, green, yellow, orange or red. Asymmetric anthracene derivatives as disclosed in U.S. Pat. No. 6,465,115 and WO 2004/018587 are also useful hosts.

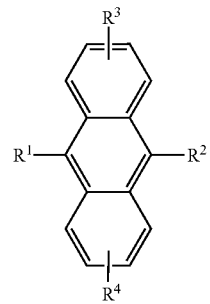

F

In Formula (F), $R^1$ and $R^2$ represent independently selected aryl groups, such as naphthyl, phenyl, biphenyl, triphenyl, anthracene. $R^3$ and $R^4$ represent one or more substituents on each ring where each substituent is individually selected from the following groups:

Group 1: hydrogen, or alkyl of from 1 to 24 carbon atoms;

Group 2: aryl or substituted aryl of from 5 to 20 carbon atoms;

Group 3: carbon atoms from 4 to 24 necessary to complete a fused aromatic ring of anthracenyl; pyrenyl, or perylenyl;

Group 4: heteroaryl or substituted heteroaryl of from 5 to 24 carbon atoms as necessary to complete a fused heteroaromatic ring of furyl, thienyl, pyridyl, quinolinyl or other heterocyclic systems;

Group 5: alkoxylamino, alkylamino, or arylamino of from 1 to 24 carbon atoms; and Group 6: fluorine or cyano.

A useful class of anthracenes are derivatives of 9,10-di-(2-naphthyl)anthracene (Formula G).

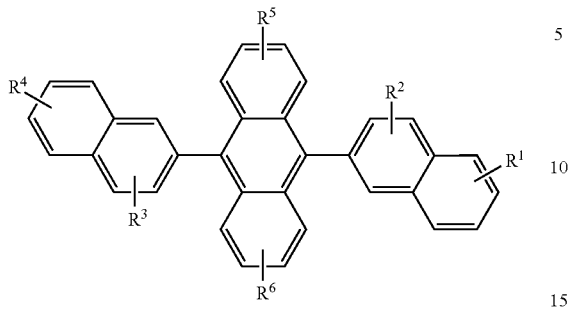

G

In Formula (G), $R^1$, $R^2$, $R^3$, $R^4$, $R^5$, and $R^6$ represent one or more substituents on each ring where each substituent is individually selected from the following groups:

Group 1: hydrogen, or alkyl of from 1 to 24 carbon atoms;

Group 2: aryl or substituted aryl of from 5 to 20 carbon atoms;

Group 3: carbon atoms from 4 to 24 necessary to complete a fused aromatic ring of anthracenyl; pyrenyl, or perylenyl;

Group 4: heteroaryl or substituted heteroaryl of from 5 to 24 carbon atoms as necessary to complete a fused heteroaromatic ring of furyl, thienyl, pyridyl, quinolinyl or other heterocyclic systems;

Group 5: alkoxylamino, alkylamino, or arylamino of from 1 to 24 carbon atoms; and Group 6: fluorine or cyano.

Illustrative examples of anthracene materials for use in a light-emitting layer include: 2-(4-methylphenyl)-9,10-di-(2-naphthyl)-anthracene; 9-(2-naphthyl)-10-(1,1'-biphenyl)-anthracene; 9,10-bis[4-(2,2-diphenylethenyl)phenyl]-anthracene, as well as the following listed compounds.

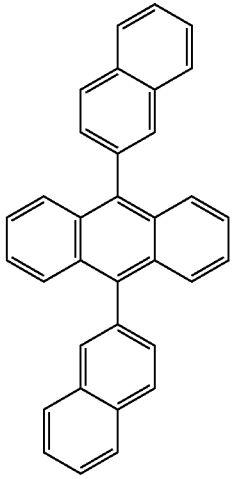

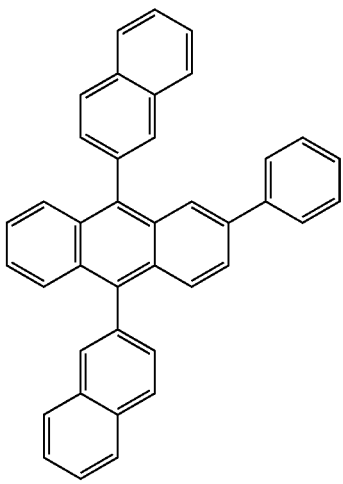

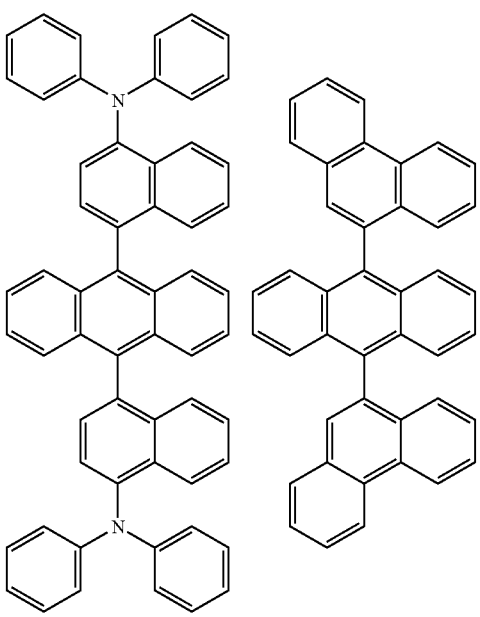

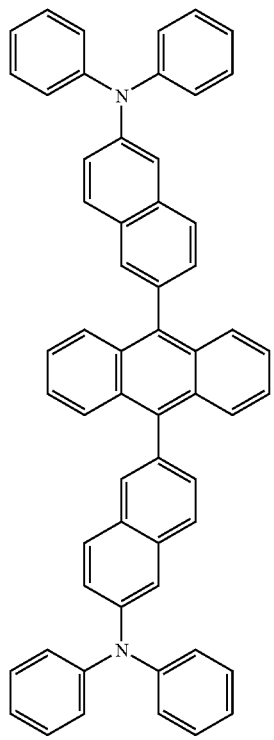
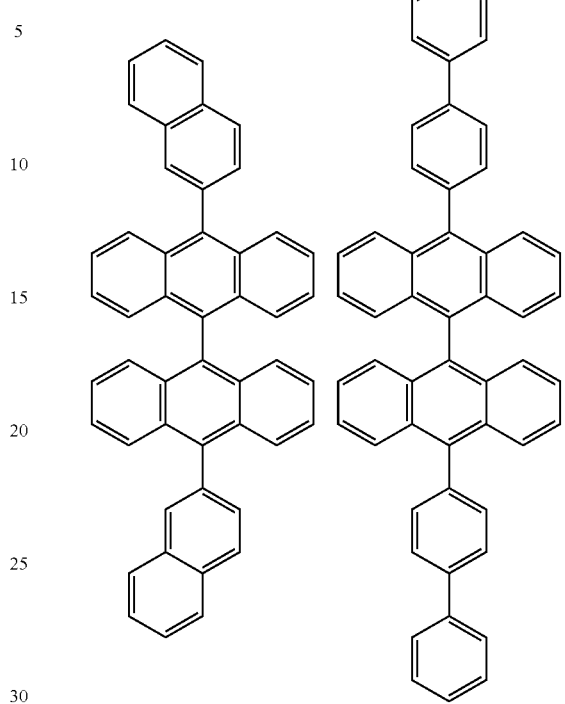
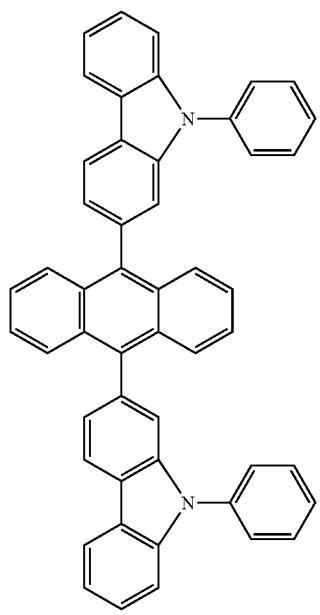
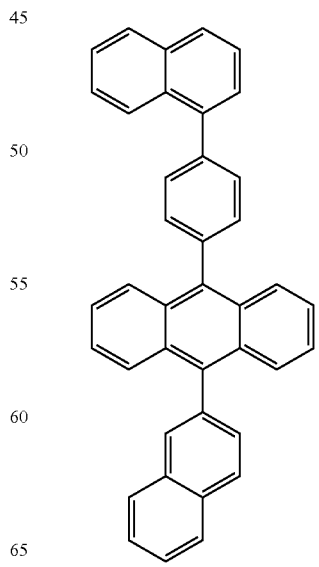

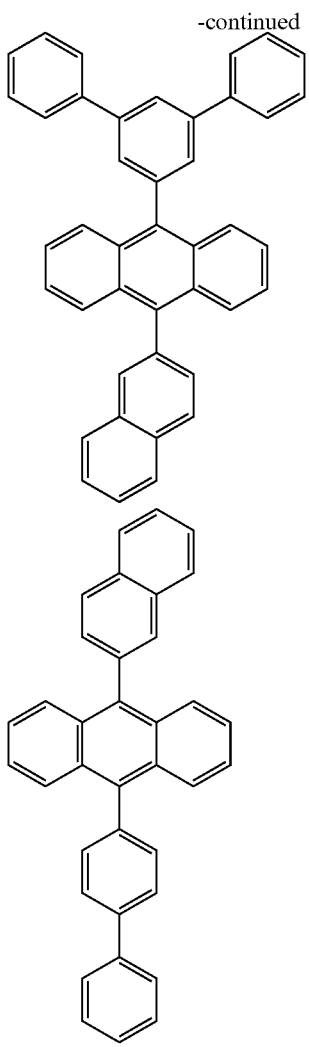

Benzazole derivatives (Formula H) constitute another class of useful host materials capable of supporting electroluminescence, and are particularly suitable for light emission of wavelengths longer than 400 nm, e.g., blue, green, yellow, orange or red.

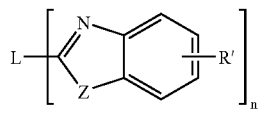

H

In Formula H, n is an integer of 3 to 8; Z is O, NR or S; and R and R' are individually hydrogen; alkyl of from 1 to 24 carbon atoms, for example, propyl, t-butyl, heptyl, and the like; aryl or hetero-atom substituted aryl of from 5 to 20 carbon atoms for example phenyl and naphthyl, furyl, thienyl, pyridyl, quinolinyl and other heterocyclic systems; or halo such as chloro, fluoro; or atoms necessary to complete a fused aromatic ring. L is a linkage unit consisting of alkyl, aryl, substituted alkyl, or substituted aryl, which conjugately or unconjugately connects the multiple benzazoles together. An example of a useful benzazole is 2,2',2"-(1,3,5-phenylene)tris [1-phenyl-1H-benzimidazole].

Distyrylarylene derivatives are also useful hosts, as described in U.S. Pat. No. 5,121,029. Carbazole derivatives are particularly useful hosts for phosphorescent emitters.

Useful fluorescent emitting materials include, but are not limited to, derivatives of anthracene, tetracene, xanthene, perylene, rubrene, coumarin, rhodamine, and quinacridone, dicyanomethylenepyran compounds, thiopyran compounds, polymethine compounds, pyrilium and thiapyrilium compounds, fluorene derivatives, periflanthene derivatives, indenoperylene derivatives, bis(azinyl)amine boron compounds, bis(azinyl)methane compounds, and carbostyryl compounds.

Examples of useful phosphorescent materials are reported in WO 00/57676, WO 00/70655, WO 01/41512, WO 02/15645, US 2003/0017361, WO 01/93642, WO 01/39234, U.S. Pat. No. 6,458,475, WO 02/071813, U.S. Pat. No. 6,573, 651, US 2002/0197511, WO 02/074015, U.S. Pat. No. 6,451, 455, US 2003/0072964, US 2003/0068528, U.S. Pat. No. 6,413,656, U.S. Pat. No. 6,515,298, U.S. Pat. No. 6,451,415, U.S. Pat. No. 6,097,147, US 2003/0124381, US 2003/ 0059646, US 2003/0054198, EP 1 239 526, EP 1 238 981, EP 1 244 155, US 2002/0100906, US 2003/0068526, US 2003/ 0068535, JP 2003073387, JP 2003073388, US 2003/ 0141809, US 2003/0040627, JP 2003059667, JP 2003073665, and US 2002/0121638.

Illustrative examples of useful fluorescent and phosphorescent emitting materials include, but are not limited to, the following compounds.

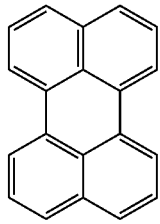

L1

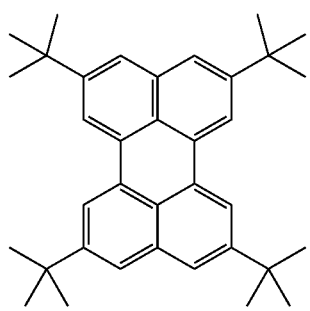

L2

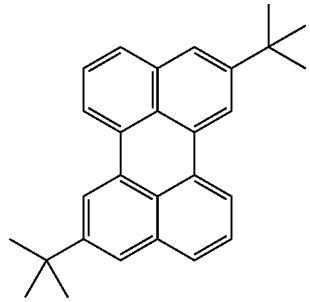

L3

-continued
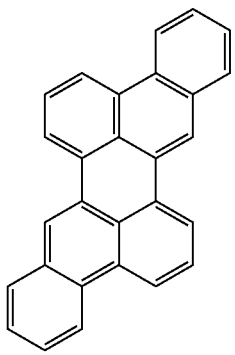
L4
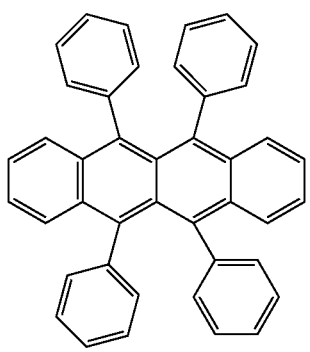
L5
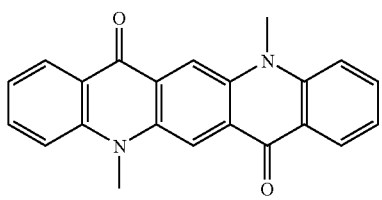
L6
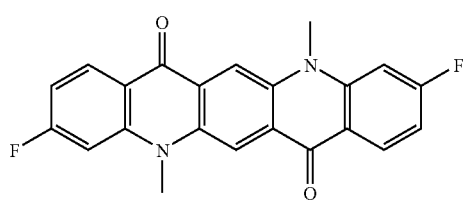
L7
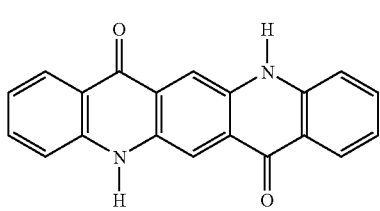
L8
-continued
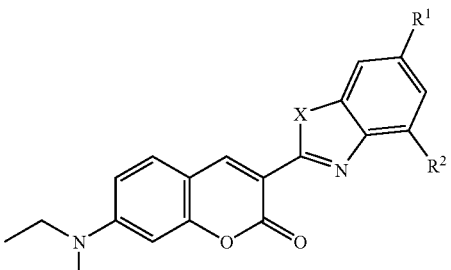
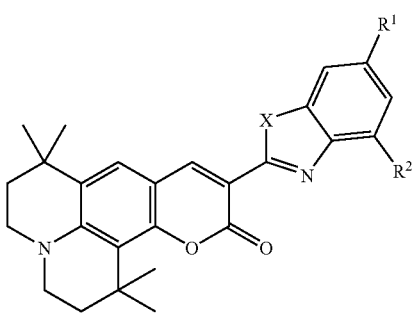
| | X | R1 | R2 |
|---|---|---|---|
| L9 | O | H | H |
| L10 | O | H | Methyl |
| L11 | O | Methyl | H |
| L12 | O | Methyl | Methyl |
| L13 | O | H | t-butyl |
| L14 | O | t-butyl | H |
| L15 | O | t-butyl | t-butyl |
| L16 | S | H | H |
| L17 | S | H | Methyl |
| L18 | S | Methyl | H |
| L19 | S | Methyl | Methyl |
| L20 | S | H | t-butyl |
| L21 | S | t-butyl | H |
| L22 | S | t-butyl | t-butyl |
| L23 | O | H | H |
| L24 | O | H | Methyl |
| L25 | O | Methyl | H |
| L26 | O | Methyl | Methyl |
| L27 | O | H | t-butyl |
| L28 | O | t-butyl | H |
| L29 | O | t-butyl | t-butyl |
| L30 | S | H | H |
| L31 | S | H | Methyl |
| L32 | S | Methyl | H |
| L33 | S | Methyl | Methyl |
| L34 | S | H | t-butyl |
| L35 | S | t-butyl | H |
| L36 | S | t-butyl | t-butyl |
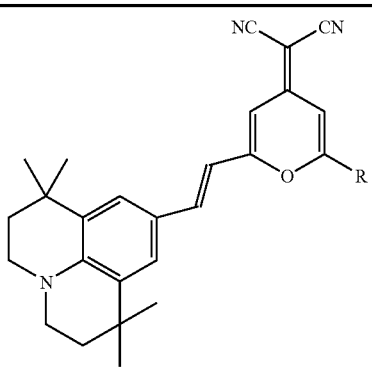

-continued
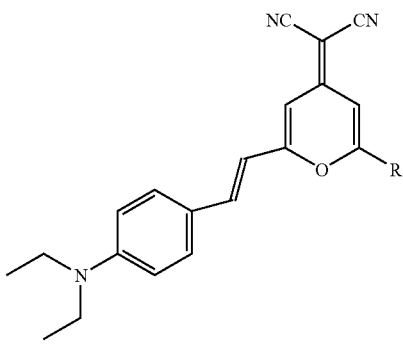
| | R |
|---|---|
| L37 | phenyl |
| L38 | methyl |
| L39 | t-butyl |
| L40 | mesityl |
| L41 | phenyl |
| L42 | methyl |
| L43 | t-butyl |
| L44 | mesityl |
L45
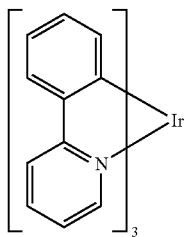
L46
-continued
L47
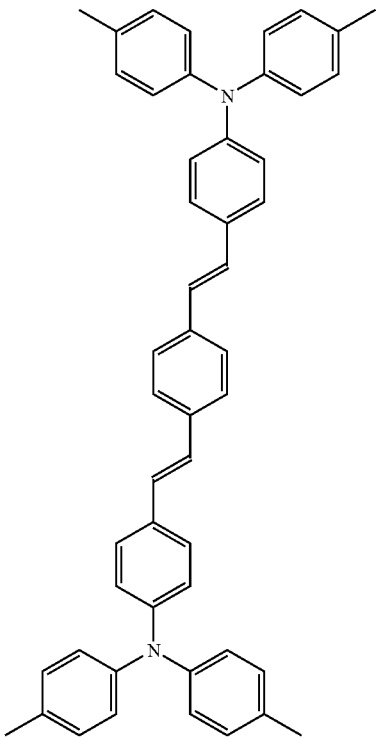
L48
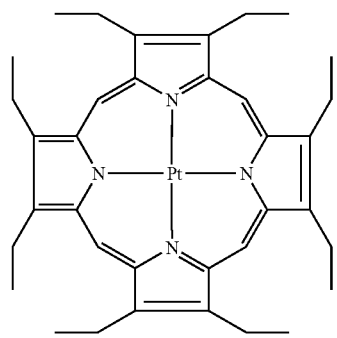
L49
L50
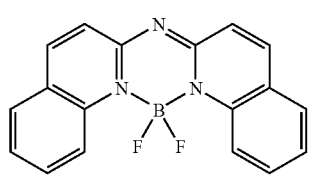

-continued
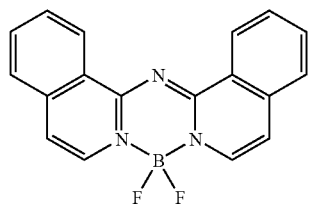 L51
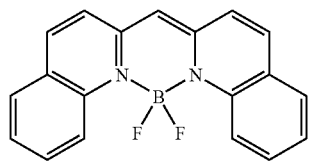 L52
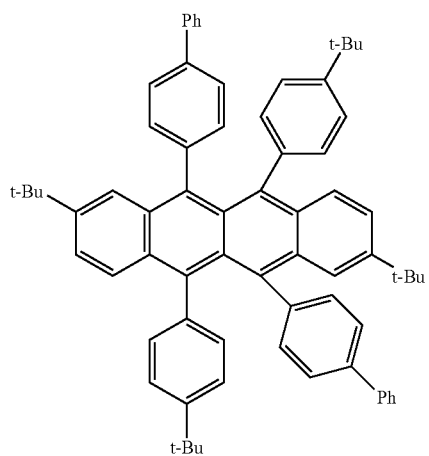 L53
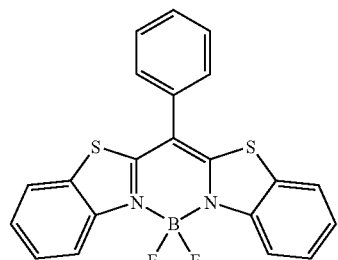 L54
-continued
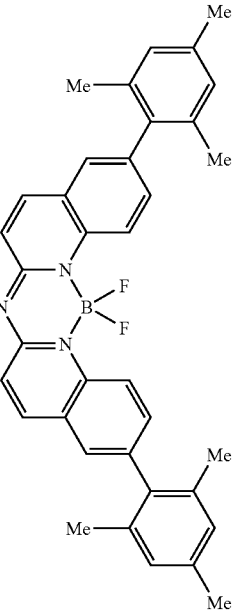 L55
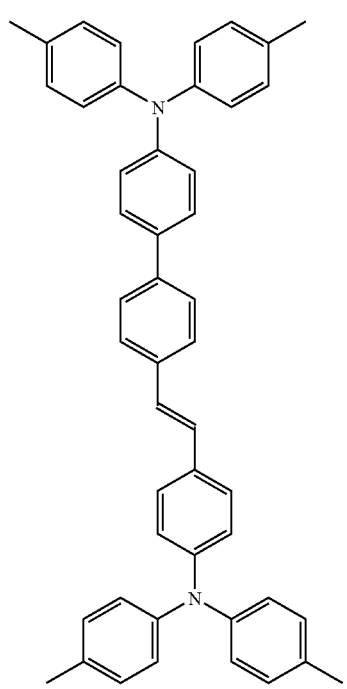 L56

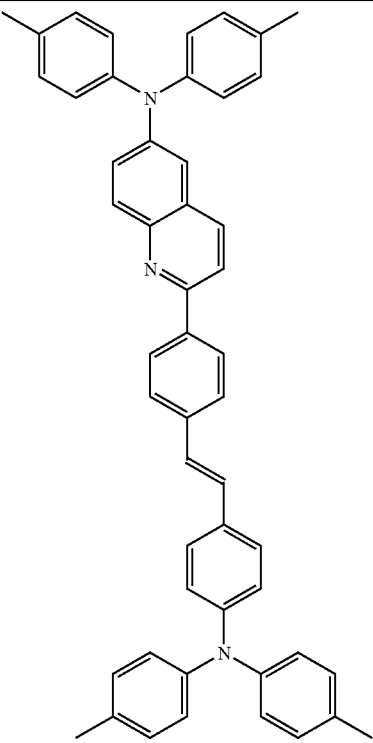

L57

Electron-Transporting Layer (ETL)

In one embodiment, the electron-transporting layer is divided into at least two layers, for example, first and second electron-transporting layers 110 and 111 of the Figure. The first layer includes a first gallium complex and the second layer includes a second gallium complex and the second complex has a more negative LUMO than the first complex. Useful first and second electron-transporting layers have been described previously. Additional electron-transporting layers maybe present. Preferred thin film-forming materials for use in forming the additional electron-transporting layer of the organic EL devices of this invention include metal chelated oxinoid compounds, including chelates of oxine itself (also commonly referred to as 8-quinolinol or 8-hydroxyquinoline). Such compounds help to inject and transport electrons and exhibit both high levels of performance and are readily fabricated in the form of thin films. Exemplary of contemplated oxinoid compounds are those satisfying structural Formula (E), previously described.

Other electron-transporting materials include various butadiene derivatives as disclosed in U.S. Pat. No. 4,356,429 and various heterocyclic optical brighteners as described in U.S. Pat. No. 4,539,507. Benzazoles satisfying structural Formula (H) are also useful electron transporting materials. Triazines are also known to be useful as electron transporting materials. Further useful materials are silacyclopentadiene derivatives described in EP 1,480,280; EP 1,478,032; and EP 1,469,533. Substituted 1,10-phenanthroline compounds such as are disclosed in JP2003-115387; JP2004-311184; JP2001-267080; and WO2002-043449. Pyridine derivatives are described in JP2004-200162 as useful electron transporting materials.

Electron-Injecting Layer (EIL)

Useful electron-injecting layers have been described previously.

Cathode

When light emission is viewed solely through the anode, the cathode used in this invention can be comprised of nearly any conductive material. Desirable materials have good film-forming properties to ensure good contact with the underlying organic layer, promote electron injection at low voltage, and have good stability. Useful cathode materials often contain a low work function metal (<4.0 eV) or metal alloy. One useful cathode material is comprised of a Mg:Ag alloy wherein the percentage of silver is in the range of 1 to 20%, as described in U.S. Pat. No. 4,885,221. Another suitable class of cathode materials includes bilayers comprising the cathode and a thin electron-injection layer (EIL) in contact with an organic layer (e.g., an electron transporting layer (ETL)), which is capped with a thicker layer of a conductive metal. Here, the EIL preferably includes a low work function metal or metal salt, and if so, the thicker capping layer does not need to have a low work function. One such cathode is comprised of a thin layer of LiF followed by a thicker layer of Al as described in U.S. Pat. No. 5,677,572. Other useful cathode material sets include, but are not limited to, those disclosed in U.S. Pat. Nos. 5,059,861; 5,059,862, and 6,140,763.

When light emission is viewed through the cathode, the cathode must be transparent or nearly transparent. For such applications, metals must be thin or one must use transparent conductive oxides, or a combination of these materials. Optically transparent cathodes have been described in more detail in U.S. Pat. No. 4,885,211, U.S. Pat. No. 5,247,190, JP 3,234,963, U.S. Pat. No. 5,703,436, U.S. Pat. No. 5,608,287, U.S. Pat. No. 5,837,391, U.S. Pat. No. 5,677,572, U.S. Pat. No. 5,776,622, U.S. Pat. No. 5,776,623, U.S. Pat. No. 5,714,838, U.S. Pat. No. 5,969,474, U.S. Pat. No. 5,739,545, U.S. Pat. No. 5,981,306, U.S. Pat. No. 6,137,223, U.S. Pat. No. 6,140,763, U.S. Pat. No. 6,172,459, EP 1 076 368, U.S. Pat. No. 6,278,236, and U.S. Pat. No. 6,284,3936. Cathode materials are typically deposited by any suitable method such as evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Other Useful Organic Layers and Device Architecture

In some instances, layers 109 and 110 can optionally be collapsed into a single layer that serves the function of supporting both light emission and electron transportation. It also known in the art that emitting materials may be included in the hole-transporting layer, which may serve as a host. Multiple materials may be added to one or more layers in order to create a white-emitting OLED, for example, by combining blue- and yellow-emitting materials, cyan- and red-emitting materials, or red-, green-, and blue-emitting materials. White-emitting devices are described, for example, in EP 1 187 235, US 20020025419, EP 1 182 244, U.S. Pat. No. 5,683,823, U.S. Pat. No. 5,503,910, U.S. Pat. No. 5,405,709, and U.S. Pat. No. 5,283,182 and may be equipped with a suitable filter arrangement to produce a color emission.

Additional layers such as electron or hole-blocking layers as taught in the art may be employed in devices of this invention. Hole-blocking layers may be used between the light emitting layer and the electron transporting layer. Electron-blocking layers may be used between the hole-transporting layer and the light emitting layer. These layers are commonly used to improve the efficiency of emission, for example, as in US 20020015859.

This invention may be used in so-called stacked device architecture, for example, as taught in U.S. Pat. No. 5,703,436 and U.S. Pat. No. 6,337,492.

Deposition of Organic Layers

The organic materials mentioned above are suitably deposited by any means suitable for the form of the organic materials. In the case of small molecules, they are conveniently deposited through sublimation, but can be deposited by other means such as from a solvent with an optional binder to improve film formation. If the material is a polymer, solvent deposition is usually preferred. The material to be deposited by sublimation can be vaporized from a sublimator "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimator boats or the materials can be pre-mixed and coated from a single boat or donor sheet. Patterned deposition can be achieved using shadow masks, integral shadow masks (U.S. Pat. No. 5,294,870), spatially-defined thermal dye transfer from a donor sheet (U.S. Pat. No. 5,688,551, U.S. Pat. No. 5,851,709 and U.S. Pat. No. 6,066,357) and inkjet method (U.S. Pat. No. 6,066,357).

One preferred method for depositing the materials of the present invention is described in U.S. 2004/0255857 and U.S. Ser. No. 10/945,941, now U.S. Pat. No. 7,288,286, where different source evaporators are used to evaporate each of the materials of the present invention. A second preferred method involves the use of flash evaporation where materials are metered along a material feed path in which the material feed path is temperature controlled. Such a preferred method is described in the following co-assigned patent applications: U.S. Ser. No. 10/784,585; U.S. Ser. No. 10/805,980; U.S. Ser. No. 10/945,940; U.S. Ser. No. 10/945,941; U.S. Ser. No. 11/050,924; and U.S. Ser. No. 11/050,934, now U.S. Pat Nos. 7,232,588; 7,238,389; 7,288,285; 7,288,286; publication No. 2006/0177576; and Pat. No. 7,165,340, respectively. Using this second method, each material may be evaporated using different source evaporators or the solid materials may be mixed prior to evaporation using the same source evaporator.

Encapsulation

Most OLED devices are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as SiOx, Teflon, and alternating inorganic/polymeric layers are known in the art for encapsulation.

Optical Optimization

OLED devices of this invention can employ various well-known optical effects in order to enhance its properties if desired. This includes optimizing layer thicknesses to yield maximum light transmission, providing dielectric mirror structures, replacing reflective electrodes with light-absorbing electrodes, providing anti glare or anti-reflection coatings over the display, providing a polarizing medium over the display, or providing colored, neutral density, or color conversion filters over the display. Filters, polarizers, and anti-glare or anti-reflection coatings may be specifically provided over the cover or as part of the cover.

Embodiments of the invention may provide advantageous features such as higher luminous yield, lower drive voltage, and higher power efficiency, longer operating lifetimes or ease of manufacture. Embodiments of devices useful in the invention can provide a wide range of hues including those useful in the emission of white light (directly or through filters to provide multicolor displays). Embodiments of the invention can also provide an area lighting device.

The invention and its advantages are further illustrated by the specific examples that follow. The term "percentage" or "percent" and the symbol "%" indicate the volume percent (or a thickness ratio as measured on a thin film thickness monitor) of a particular first or second compound of the total material in the layer of the invention and other components of the devices. If more than one second compound is present, the total volume of the second compounds can also be expressed as a percentage of the total material in the layer of the invention.

EXAMPLE 1

Synthesis of Inv-2

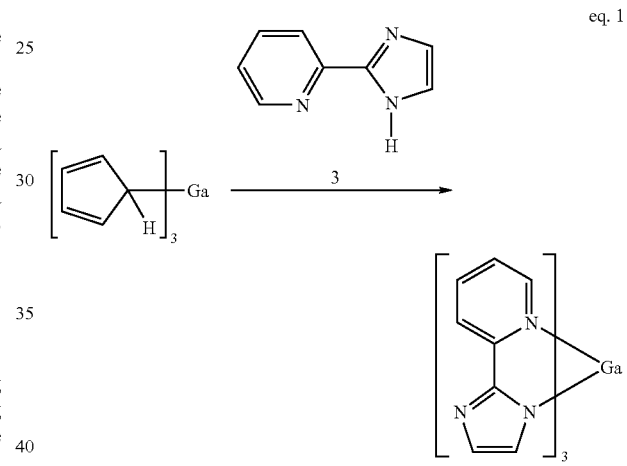

eq. 1

Inv-2 was prepared by the following procedure (eq. 1). Working in a drybox, 0.334 g (1.26 mmol) of gallium tris (cyclopentadienyl)gallium was placed into a 100 mL reaction flask and dissolved in 15 mL of toluene. The addition of three equivalents of solid 2-(2-pyridyl)imidazole resulted in the formation an orange precipitate. The flask was sealed with a Rodaviss adapter. The reaction flask was removed from the drybox and was placed in an oil bath and heated for 3 h at 85° C. After removing the oil bath the reaction mixture was allowed to stir overnight.

The solvent was removed invacuo leaving a pale yellow solid. After washing with pentane, 607 mg of the crude product was isolated. Sublimation of the crude product at 310° C. using a high vacuum sublimation system yielded 290 mg of product (Inv-2). The structure of Inv-2 was confirmed by NMR and Mass Spectral analysis.

EXAMPLE 2

Electrochemical Redox Potentials and Estimated Energy Levels

LUMO and HOMO values are typically estimated experimentally by electrochemical methods. A Model CHI660 electrochemical analyzer (CH Instruments, Inc., Austin, Tex.)

was employed to carry out the electrochemical measurements. Cyclic voltammetry (CV) and Osteryoung square-wave voltammetry (SWV) were used to characterize the redox properties of the compounds of interest. A glassy carbon (GC) disk electrode (A=0.071 cm$^2$) was used as working electrode. The GC electrode was polished with 0.05 μm alumina slurry, followed by sonication cleaning in Milli-Q deionized water twice and rinsed with acetone in between water cleaning. The electrode was finally cleaned and activated by electrochemical treatment prior to use. A platinum wire served as counter electrode and a saturated calomel electrode (SCE) was used as a quasi-reference electrode to complete a standard 3-electrode electrochemical cell. Ferrocene (Fc) was used as an internal standard ($E_{Fc}$=0.50 V vs. SCE in 1:1 acetonitrile/toluene, 0.1 M TBAF). A mixture of acetonitrile and toluene (50%/50% v/v, or 1:1) was used as the organic solvent system. The supporting electrolyte, tetrabutylammonium tetrafluoroborate (TBAF) was recrystallized twice in isopropanol and dried under vacuum. All solvents used were low water grade (<20 ppm water). The testing solution was purged with high purity nitrogen gas for approximately 5 minutes to remove oxygen and a nitrogen blanket was kept on the top of the solution during the course of the experiments. All measurements were performed at ambient temperature of 25±1° C. The oxidation and reduction potentials were determined either by averaging the anodic peak potential (Ep,a) and cathodic peak potential (Ep,c) for reversible or quasi-reversible electrode processes or on the basis of peak potentials (in SWV) for irreversible processes. LUMO and HOMO values are calculated from the following:

Formal reduction potentials vs. SCE for reversible or quasi-reversible processes;

$$E^{O'}_{red}=(E_{pa}+E_{pc})/2$$

$$E^{O'}_{ox}=(E_{pa}+E_{pc})/2$$

Formal reduction potentials vs. Fc;

$$E^{O'}_{red} \text{ vs. } Fc=(E^{O'}_{red} \text{ vs. } SCE)-E_{Fc}$$

$$E^{O}_{ox} \text{ vs. } Fc=\text{vs. } Fc=(E^{O}_{ox} \text{ vs. } SCE)-E_{Fc}$$

where $E_{Fc}$ is the oxidation potential $E_{ox}$, of ferrocene;

Estimated lower limit for LUMO and HOMO values;

$$LUMO=HOMO_{Fc}-(E^{O'}_{red} \text{ vs. } Fc)$$

$$HOMO=HOMO_{Fc}-(E^{O}_{ox} \text{ vs. } Fc)$$

where HOMO$_{Fc}$ (Highest Occupied Molecular Orbital for ferrocene)=−4.8 eV.

Estimated redox potentials as well as HOMO and LUMO values are summarized in Table 1.

TABLE 1

Redox Potentials and Estimated Energy Levels.

| Compound | E$^{o'}$(ox) V vs. SCE | E$^{o'}$(red) V vs. SCE | E$^{o'}$(red) V vs. FC | HOMO (eV) | LUMO (eV) |
|---|---|---|---|---|---|
| Inv-1 | >1.60$^a$ | −1.63$^a$ | −2.13 | <−5.90 | −2.67 |
| Inv-2 | 1.33$^a$ | −1.85$^a$ | −2.35 | −5.63 | −2.45 |
| Alq | 1.35 | −1.75 | −2.25 | −5.65 | −2.50 |
| HM-1 | 1.285 | −1.779 | −2.279 | −5.58 | −2.52 |
| HM-2 | 1.308 | −1.855 | −2.355 | −5.61 | −2.44 |

$^a$Estimated from peak potential at net peak current of SWV at 15 Hz

TABLE 1-continued

Redox Potentials and Estimated Energy Levels.

| Compound | E$^{o'}$(ox) V vs. SCE | E$^{o'}$(red) V vs. SCE | E$^{o'}$(red) V vs. FC | HOMO (eV) | LUMO (eV) |
|---|---|---|---|---|---|

(HM-1)

(HM-2)

EXAMPLE 3

Preparation of Devices 1-1 Through 1-3

Comparative device 1-1 was constructed in the following manner.

1. A glass substrate coated with about a 21.5 nm layer of indium-tin oxide (ITO), as the anode, was sequentially ultrasonicated in a commercial detergent, rinsed in deionized water, degreased in toluene vapor and exposed to an oxygen plasma for about 1 min.
2. Over the ITO was deposited a 1 nm fluorocarbon (CFx) hole-injecting layer (HIL) by plasma-assisted deposition of CHF$_3$ as described in U.S. Pat. No. 6,208,075.
3. Next, a layer of a second hole-injecting material (HI-1) was deposited to a thickness of 85 nm.
4. Subsequently a layer of hole-transporting material 4,4'-Bis[N-(1-naphthyl)-N-phenylamino]biphenyl (NPB) was deposited to a thickness of 10 nm.

5. A 40 nm light-emitting layer (LEL) corresponding to the host material 9,10-di(2-naphthyl)-2-phenylanthracene (HM-1) and including 0.75% of light-emitting material D-1 was then deposited.
6. An electron-transporting layer (ETL) corresponding to 15 nm of tris(8-quinolinolato)aluminum(III) (Alq) was vacuum-deposited over the LEL.
7. A 0.5 nm electron-injecting layer of lithium fluoride was vacuum deposited onto the ETL, followed by a 150 nm layer of aluminum, to form a cathode layer.

The above sequence completed the deposition of the EL device. The device was then hermetically packaged in a nitrogen atmosphere along with calcium sulfate as a desiccant in a dry glove box for protection against ambient environment.

Comparative device 1-2 was prepared in the same manner as device 1-1, except in the electron-transporting layer Alq was replaced with Inv-1. Inventive device 1-3 was also prepared in the same manner as device 1-1, except the electron-transporting layer consisted of a bilayer corresponding to a first layer (ETL-1) of Inv-2 deposited over the LEL to a thickness of 1 nm followed by a second layer (ETL) corresponding to a 14 nm layer of Inv-1 (see Table 2a). The total thickness of the electron-transporting layer was 15 nm for each device.

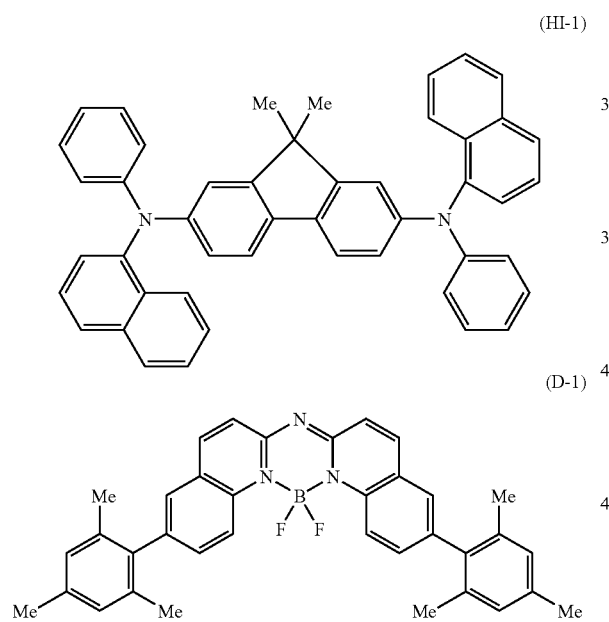

(HI-1)

(D-1)

TABLE 2a

The electron-transporting layer of devices 1-1, 1-2, and 1-3.

| Device | Type | ETL-1 Material | ETL-1 Thickness (nm) | ETL Material | ETL Thickness (nm) |
|---|---|---|---|---|---|
| 1-1 | Comparative | — | — | AlQ | 15.0 |
| 1-2 | Comparative | — | — | Inv-1 | 15.0 |
| 1-3 | Inventive | Inv-2 | 1.0 | Inv-1 | 14.0 |

The devices were tested for luminous efficiency and color at an operating current of 20 mA/cm$^2$ and the results are reported in Table 2b in the form of luminous yield (cd/A) and efficiency (w/A), where device efficiency is the radiant flux (in watts) produced by the device per amp of input current, where radiant flux is the light energy produced by the device per unit time. Light intensity is measured perpendicular to the device surface, and it is assumed that the angular profile is Lambertian. The color of light produced by the devices is reported in 1931 CIE (Commission Internationale de L'Eclairage) coordinates. Drive voltage is reported in volts.

Device stability was determined by operating the device under conditions in which the initial light output of the device was 1000 cd/m$^2$ at ambient temperature (approximately 23° C.). The light output was monitored and Table 2b lists the amount of time required ($T_{80}$) for the luminance to reach 80% of its initial value.

TABLE 2b

Testing results for devices 1-1, 1-2, and 1-3.

| Device | Type | CIE x | CIE y | Lum. Yield (cd/A) | Efficiency (W/A) | Volt. (V) | Stability $T_{80}$ (h) |
|---|---|---|---|---|---|---|---|
| 1-1 | Comparative | 0.14 | 0.15 | 4.60 | 0.10 | 7.4 | 180 |
| 1-2 | Comparative | 0.14 | 0.15 | 5.48 | 0.12 | 5.5 | 320 |
| 1-3 | Inventive | 0.14 | 0.15 | 5.52 | 0.12 | 5.6 | 380 |

It can be seen from Table 2b that the inventive device 1-3 affords higher luminance, lower voltage, and improved stability relative to the comparative device 1-1. It also offers improved stability over comparative device 1-2.

EXAMPLE 4

Preparation of Devices 2-1 Through 2-8

Comparative device 2-1 was constructed in the following manner.
1. A glass substrate coated with about a 21.5 nm layer of indium-tin oxide (ITO), as the anode, was sequentially ultrasonicated in a commercial detergent, rinsed in deionized water, degreased in toluene vapor and exposed to oxygen plasma for about 1 min.
2. Over the ITO was deposited a 1 nm fluorocarbon (CFx) hole-injecting layer (HIL) by plasma-assisted deposition of CHF$_3$ as described in U.S. Pat. No. 6,208,075.
3. Next a layer of a second hole-injecting material (HI-1) was deposited to a thickness of 85 nm.
4. Subsequently a layer of hole-transporting material 4,4'-Bis[N-(1-naphthyl)-N-phenylamino]biphenyl (NPB) was deposited to a thickness of 10 nm.
5. A 40 nm light-emitting layer (LEL) corresponding to the host material 9-9,10-di(2-naphthyl)-2-phenylanthracene (HM-1) and including 0.75% of light-emitting material D-1 was then deposited.
6. An electron-transporting layer (ETL) corresponding to 30 nm of tris(8-quinolinolato)aluminum(III) (Alq) was vacuum-deposited over the LEL.
7. A 0.5 nm electron-injecting layer of lithium fluoride was vacuum deposited onto the ETL, followed by a 150 nm layer of aluminum, to form a cathode layer.

The above sequence completed the deposition of the EL device. The device was then hermetically packaged in a nitrogen atmosphere along with calcium sulfate as a desiccant in a dry glove box for protection against ambient environment.

Comparative device 2-2 and 2-3 were prepared in the same manner as device 2-1, except in the electron-transporting layer Alq was replaced with Inv-1 and Inv-2 respectively. Inventive devices 2-4 through 2-8 were also prepared in the same manner as device 2-1, except the electron-transporting layer consisted of a bilayer corresponding to a first layer (ETL-1) of Inv-2 deposited over the LEL (see Table 3a for the thickness of this layer). A second layer (ETL) was then deposited over the ETL-1 layer to a thickness also given in Table 3a. The total thickness of the electron-transporting layer was 30 nm for each device. A 0.5 nm electron-injecting layer of lithium fluoride was vacuum deposited onto the ETL, followed by a 150 nm layer of aluminum, to form a cathode layer. The devices were then hermetically packaged in a nitrogen atmosphere along with calcium sulfate as a desiccant in a dry glove box for protection against ambient environment.

TABLE 3a

The electron-transporting layer of devices 2-1 through 2-8.

| Device | Type | ETL-1 Material | ETL-1 Thickness (nm) | ETL Material | ETL Thickness (nm) |
|---|---|---|---|---|---|
| 2-1 | Comparative | — | — | AlQ | 30.0 |
| 2-2 | Comparative | — | — | Inv-1 | 30.0 |
| 2-3 | Comparative | — | — | Inv-2 | 30.0 |
| 2-4 | Inventive | Inv-2 | 0.5 | Inv-1 | 29.5 |
| 2-5 | Inventive | Inv-2 | 1.0 | Inv-1 | 29.0 |
| 2-6 | Inventive | Inv-2 | 1.5 | Inv-1 | 28.5 |
| 2-7 | Inventive | Inv-2 | 2.5 | Inv-1 | 27.5 |
| 2-8 | Inventive | Inv-2 | 5.0 | Inv-1 | 25.0 |

The devices 2-1 through 2-8 were tested in the same manner as device 1-1 and the results are reported in Table 3b.

TABLE 3b

Testing results for devices 2-1 through 2-8.

| Device | Type | CIE x | CIE y | Lum. Yield (cd/A) | Efficiency (W/A) | Volt. (V) | Stability $T_{80}$ (h) |
|---|---|---|---|---|---|---|---|
| 2-1 | Comparative | 0.15 | 0.20 | 4.60 | 0.08 | 8.1 | 532 |
| 2-2 | Comparative | 0.14 | 0.17 | 5.53 | 0.11 | 6.1 | 250 |
| 2-3 | Comparative | 0.14 | 0.16 | 7.30 | 0.15 | 7.1 | 8 |
| 2-4 | Inventive | 0.14 | 0.17 | 5.45 | 0.11 | 6.3 | 336 |
| 2-5 | Inventive | 0.15 | 0.18 | 5.66 | 0.11 | 6.0 | 422 |
| 2-6 | Inventive | 0.15 | 0.17 | 5.65 | 0.11 | 6.2 | 421 |
| 2-7 | Inventive | 0.14 | 0.17 | 5.85 | 0.11 | 6.1 | 460 |
| 2-8 | Inventive | 0.14 | 0.17 | 6.70 | 0.13 | 6.3 | 512 |

It can be seen from Table 3b that inventive devices 2-4 through 2-8 afford higher luminance and reduced drive voltage relative to device 2-1. The inventive devices, which have an electron-transporting bilayer composed of two different gallium complexes, afford improved stability compared to devices 2-2 and 2-3 having a single layer of gallium material.

EXAMPLE 5

Preparation of Devices 3-1 Through 3-4

Comparative device 3-1 was constructed in the following manner.

1. A glass substrate coated with about a 21.5 nm layer of indium-tin oxide (ITO), as the anode, was sequentially ultrasonicated in a commercial detergent, rinsed in deionized water, degreased in toluene vapor and exposed to oxygen plasma for about 1 min.
2. Over the ITO was deposited a 1 nm fluorocarbon (CFx) hole-injecting layer (HIL) by plasma-assisted deposition of $CHF_3$ as described in U.S. Pat. No. 6,208,075.
3. Subsequently a layer of hole-transporting material 4,4'-Bis[N-(1-naphthyl)-N-phenylamino]biphenyl (NPB) was deposited to a thickness of 7.5 nm.
4. A 20 nm light-emitting layer (LEL) corresponding to the host material 9-(4-biphenyl)-10-(2-naphthyl)anthracene (HT-2) and including 7% of light-emitting material D-2 was then deposited.
5. An electron-transporting layer (ETL) corresponding to 35 nm of tris(8-quinolinolato)aluminum(III) (Alq) was vacuum-deposited over the LEL.
6. A 0.5 nm electron-injecting layer of lithium fluoride was vacuum deposited onto the ETL, followed by a 150 nm layer of aluminum, to form a cathode layer.

The above sequence completed the deposition of the EL device. The device was then hermetically packaged in a nitrogen atmosphere along with calcium sulfate as a desiccant in a dry glove box for protection against ambient environment.

Comparative device 3-2 and 3-3 were prepared in the same manner as device 3-1, except in the electron-transporting layer Alq was replaced with Inv-1 and Inv-2 respectively. Inventive device 3-4 was also prepared in the same manner as device 3-1, except the electron-transporting layer consisted of a bilayer corresponding to a first layer (ETL-1) of Inv-2 deposited over the LEL to a thickness of 5 nm and a second layer (ETL) of Inv-1 deposited over the ETL-1 to a thickness of 30 nm. For each device the total thickness of the electron-transporting layer was 35 nm (see Table 4a). In device 3-2 through 3-4 the dopant D-2 was at a level of 6% instead of 7% by volume.

Devices 3-1 through 3-4 were tested in the same manner as device 1-1 and the results are listed in Table 4b.

(D-2)

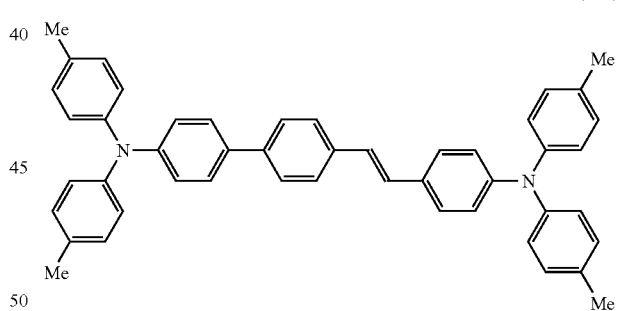

TABLE 4a

The electron-transporting layer of devices 3-1 through 3-4.

| Device | Type | ETL-1 Material | ETL-1 Thickness (nm) | ETL Material | ETL Thickness (nm) |
|---|---|---|---|---|---|
| 3-1 | Comparative | — | — | AlQ | 35 |
| 3-2 | Comparative | — | — | Inv-1 | 35 |
| 3-3 | Comparative | — | — | Inv-2 | 35 |
| 3-4 | Inventive | Inv-2 | 5 | Inv-1 | 30 |

TABLE 4b

Testing results for devices 3-1 through 3-4.

| Device | Type | CIE x | CIE y | Lum. Yield (cd/A) | Efficiency (W/A) | Volt.[1] (V) |
|---|---|---|---|---|---|---|
| 3-1 | Comparative[2] | 0.15 | 0.19 | 5.53 | 0.097 | 6.4 |
| 3-2 | Comparative[3] | 0.14 | 0.17 | 7.19 | 0.136 | 5.6 |
| 3-3 | Comparative[3] | 0.14 | 0.17 | 7.87 | 0.148 | 5.9 |
| 3-4 | Inventive[3] | 0.14 | 0.17 | 9.15 | 0.174 | 5.0 |

[1]Voltage corrected for ITO resistivity.
[2]Dopant (D-2) level 7%.
[3]Dopant (D-2) level 6%.

The inventive device, 3-4, containing two electron-transporting layers consisting of different gallium complexes affords both higher luminance and reduced drive voltage relative to the comparison devices.

EXAMPLE 6

Preparation of Devices 4-1 Through 4-9

Comparative device 4-1 was fabricated in exactly the same manner as device 1-1 and including D-1 as the emissive material in the LEL. In both cases the electron-transporting layer consisted of 15 nm of Alq. Device 4-2, 4-3, and 4-4 were prepared in the same manner, except the electron-transporting layer was 30 nm of Alq, Inv-2, or Inv-1 respectively (see Table 5a). For devices 4-4 through 4-9, the electron-transporting layer was a bilayer corresponding to ETL-1 deposited over the LEL and then a layer, ETL, deposited over the ETL-1 layer. The composition and thickness of ETL-1 and ETL are shown in Table 5a as well as the thickness of the entire electron-transporting layer. A 0.5 nm electron-injecting layer of lithium fluoride was vacuum deposited onto the ETL, followed by a 150 nm layer of aluminum, to form a cathode layer. The devices were then hermetically packaged in a nitrogen atmosphere along with calcium sulfate as a desiccant in a dry glove box for protection against ambient environment TABLE 5a The electron-transporting layer of devices 4-1 through 4-9.

| Device | Type | ETL-1 Material | ETL-1 Thick. (nm) | ETL Material | ETL Thick. (nm) | Total Thick. (nm) |
|---|---|---|---|---|---|---|
| 4-1 | Comparative | — | — | Alq | 15.0 | 15.0 |
| 4-2 | Comparative | — | — | Alq | 30.0 | 30.0 |
| 4-3 | Comparative | — | — | Inv-2 | 30.0 | 30.0 |
| 4-4 | Comparative | — | — | Inv-1 | 30.0 | 30.0 |
| 4-5 | Inventive | Inv-2 | 5.0 | Inv-1 | 25.0 | 30.0 |
| 4-6 | Comparative | Inv-1 | 5.0 | Inv-2 | 25.0 | 30.0 |
| 4-7 | Comparative | Alq | 5.0 | Inv-1 | 25.0 | 30.0 |
| 4-8 | Inventive | Inv-2 | 10.0 | Inv-1 | 20.0 | 30.0 |
| 4-9 | Comparative | Alq | 10.0 | Inv-1 | 20.0 | 30.0 |

The devices were tested for color, stability, luminous efficiency and voltage in the same manner as device 1-1 and the results are listed in Table 5b.

TABLE 5b

Testing results for devices 4-1 through 4-9.

| Device | Type | CIEx | CIEy | Stability $T_{80}$ (h) | Lum. Yield (cd/A) | Eff. (W/A) | Volt. (V) |
|---|---|---|---|---|---|---|---|
| 4-1 | Comparative | 0.14 | 0.15 | 87 | 4.72 | 0.10 | 7.7 |
| 4-2 | Comparative | 0.15 | 0.20 | 360 | 4.74 | 0.08 | 8.2 |
| 4-3 | Comparative | 0.14 | 0.15 | 10 | 7.13 | 0.15 | 7.3 |
| 4-4 | Comparative | 0.14 | 0.16 | 330 | 5.88 | 0.12 | 6.1 |
| 4-5 | Inventive | 0.14 | 0.16 | 390 | 7.03 | 0.14 | 6.3 |
| 4-6 | Comparative | 0.14 | 0.16 | 0.10 | 6.84 | 0.14 | 7.6 |
| 4-7 | Comparative | 0.14 | 0.16 | 260 | 6.45 | 0.13 | 7.1 |
| 4-8 | Inventive | 0.14 | 0.15 | 146 | 7.36 | 0.16 | 6.5 |
| 4-9 | Comparative | 0.14 | 0.17 | 500 | 5.68 | 0.11 | 7.4 |

The electron-transporting layer of inventive device 4-5 consists of a bilayer corresponding to Inv-1 on the cathode-side and Inv-2 on the anode side of the bilayer. Inv-1 has a more negative LUMO than Inv-2 (Table 1). Device 4-5 affords lower voltage or higher luminance or both relative to comparative devices 4-1 through 4-4, which have only a single material in the electron-transporting layer.

In device 4-6, the bilayer is reversed and material on the cathode-side, Inv-2, has a more positive LUMO value than the material on the anode-side of the bilayer, Inv-1. This results in a loss in luminance and increase in voltage for this device relative to 4-5. The stability of comparative device 4-6 is very poor.

Devices 4-7 and 4-9 use an aluminum complex in the ETL-1 layer and a gallium complex in the ETL. They should be compared to 4-6 and 4-8 respectively. In both cases the use of the aluminum complex results in lower luminance and higher voltage relative to their comparison using two gallium complexes.

The entire contents of the patents and other publications referred to in this specification are incorporated herein by reference. The invention has been described in detail with particular reference to certain preferred embodiments thereof, but it will be understood that variations and modifications can be effected within the spirit and scope of the invention.

PARTS LIST

101 Substrate
103 Anode
105 Hole-Injecting layer (HIL)
107 Hole-Transporting Layer (HTL)
109 Light-Emitting layer (LEL)
110 First Electron-Transporting layer (ETL-1)
111 Second Electron-Transporting layer (ETL)
112 Electron-Injecting layer (EIL)
113 Cathode
150 Power Source
160 Conductor

The invention claimed is:

1. An OLED device comprising an anode, a light emitting layer, only one first layer, only one second layer contiguous to the first layer, and a cathode, in that order, and wherein the first layer includes a first complex comprising gallium and the second layer includes a second complex also comprising gallium and wherein the second complex has a more negative LUMO than the first complex; wherein the first complex is represented by Formula (3a) and the second complex is represented by Formula (3b):

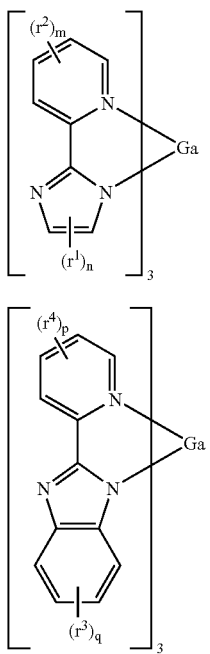

wherein:
each r¹ may be the same or different and each represents a substituent and n is 0-2;
each r², r³, and r⁴ may be the same or different and each represents a substituent, provided adjacent substituents may combine to form a ring group and m, p, and q are independently 0-4.

2. The device of claim 1 wherein the difference in the LUMO value of the first and second complexes is 0.1 eV or greater.

3. The device of claim 1 wherein the difference in the LUMO value of the first and second complexes is 0.2 eV or greater.

4. The device of claim 1 wherein the first layer is contiguous to a light-emitting layer.

5. The device of claim 1 wherein the light-emitting layer includes a host material, and wherein the host material has a LUMO value that is more negative than the LUMO value of the first complex.

6. The device of claim 1 wherein the light-emitting layer includes a host material, and wherein the difference in LUMO values between the host material and the first complex is 0.1 eV or less.

7. The device of claim 1 wherein the second layer is contiguous to an electron-injecting layer.

8. The device of claim 1 wherein the second layer comprises an alkali metal material.

9. The device of claim 8 wherein the alkali metal material comprises lithium.

10. The device of claim 1 wherein the light-emitting layer includes a material that emits blue or blue-green light.

11. The device of claim 1 wherein the light-emitting layer includes a host material that comprises an anthracene group.

12. The device of claim 1 wherein the light-emitting layer includes a host material that comprises an anthracene group bearing independently selected aromatic substituents in the 2-, 9-, and 10-positions.

* * * * *